(12) United States Patent
Nakamura et al.

(10) Patent No.: US 9,641,152 B2
(45) Date of Patent: May 2, 2017

(54) ACOUSTIC WAVE DEVICE

(71) Applicant: TAIYO YUDEN CO., LTD., Tokyo (JP)

(72) Inventors: Kentaro Nakamura, Tokyo (JP); Jun Tsutsumi, Tokyo (JP); Yoshio Sato, Tokyo (JP); Tabito Tanaka, Tokyo (JP); Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 99 days.

(21) Appl. No.: 14/824,878

(22) Filed: Aug. 12, 2015

(65) Prior Publication Data

US 2016/0182010 A1 Jun. 23, 2016

(30) Foreign Application Priority Data

Dec. 19, 2014 (JP) ................. 2014-258017

(51) Int. Cl.
*H03H 9/145* (2006.01)
*H03H 9/64* (2006.01)
*H03H 9/05* (2006.01)

(52) U.S. Cl.
CPC ........ *H03H 9/14547* (2013.01); *H03H 9/059* (2013.01); *H03H 9/1452* (2013.01);
(Continued)

(58) Field of Classification Search
CPC .. H03H 9/145; H03H 9/1452; H03H 9/14547; H03H 9/14561; H03H 9/14564;
(Continued)

(56) References Cited

U.S. PATENT DOCUMENTS 8,803,402 B2* 8/2014 Ikeuchi .............. H03H 9/02858
310/313 A
2011/0068655 A1 3/2011 Solal et al.
(Continued)

FOREIGN PATENT DOCUMENTS

JP 7-22898 A 1/1995
JP 9-162679 A 6/1997
(Continued)

OTHER PUBLICATIONS

Korean Office Action dated Jul. 25, 2016, in a counterpart Korean patent application No. 10-2015-0141702.

*Primary Examiner* — Barbara Summons
(74) *Attorney, Agent, or Firm* — Chen Yoshimura LLP

(57) ABSTRACT

An acoustic wave device includes: a piezoelectric substrate; and an IDT formed on the piezoelectric substrate, wherein an anisotropy coefficient is positive, an overlap region where electrode fingers of the IDT overlap each other includes a center region and an edge region, the electrode fingers in the center and edge regions are continuously formed, the electrode finger in the edge region is inclined with respect to the electrode finger in the center region so that a pitch in a width direction of the electrode finger in the edge region is greater than a pitch in a width direction of the electrode finger in the center region, and an angle between the width direction in the center region and a crystal axis orientation of the piezoelectric substrate is less than an angle between the width direction in the edge region and the crystal axis orientation.

14 Claims, 28 Drawing Sheets

(52) U.S. Cl.
CPC ...... *H03H 9/1457* (2013.01); *H03H 9/14561* (2013.01); *H03H 9/14564* (2013.01); *H03H 9/14594* (2013.01); *H03H 9/64* (2013.01); *H03H 9/6483* (2013.01)

(58) Field of Classification Search
CPC .... H03H 9/1457; H03H 9/14594; H03H 9/64; H03H 9/6483; H03H 9/02559; H03H 9/02818
USPC ....... 333/193–196; 310/313 B, 313 C, 313 D
See application file for complete search history.

(56) References Cited

U.S. PATENT DOCUMENTS

| | | |
|---|---|---|
| 2012/0161577 A1 | 6/2012 | Abbott et al. |
| 2012/0286624 A1* | 11/2012 | Ikeuchi .............. H03H 9/02858 310/313 B |
| 2013/0051588 A1 | 2/2013 | Ruile et al. |
| 2016/0126928 A1 | 5/2016 | Ruile et al. |

FOREIGN PATENT DOCUMENTS

| | | |
|---|---|---|
| JP | 2006-203778 A | 8/2006 |
| JP | 2006-333024 A | 12/2006 |
| JP | 2010-010874 A | 1/2010 |
| JP | 2011-101350 A | 5/2011 |
| JP | 2012-186808 A | 9/2012 |
| KR | 10-2012-0120355 A | 11/2012 |

\* cited by examiner

X-AXIS ORIENTATION

X-AXIS ORIENTATION

ACOUSTIC WAVE DEVICE

CROSS-REFERENCE TO RELATED APPLICATION

This application is based upon and claims the benefit of priority of the prior Japanese Patent Application No. 2014-258017, filed on Dec. 19, 2014, the entire contents of which are incorporated herein by reference.

FIELD

A certain aspect of the present invention relates to an acoustic wave device.

BACKGROUND

Filters and duplexers used for mobile communications such as smartphones and mobile phones employ acoustic wave devices such as surface acoustic wave devices including an Interdigital Transducer (IDT) formed on a piezoelectric substrate. The acoustic wave device including the IDT has a problem of undesired lateral-mode waves. Japanese Patent Application Publication No. 7-22898 (Patent Document 1) discloses the use of an apodized IDT to reduce undesired lateral-mode waves. Japanese Patent Application Publication No. 2011-101350 (Patent Document 2) discloses making the width of an electrode finger in an edge region of an overlap region of the IDT greater than the width of the electrode finger in a center region of the overlap region to reduce undesired lateral-mode waves. Japanese Patent Application Publication No. 2012-186808 (Patent Document 3) discloses adding a dielectric film or a metal film to the electrode finger in the edge region to reduce undesired lateral-mode waves. Japanese Patent Application Publication Nos. 2006-333024, 9-162679, and 2006-203778 disclose providing a region, the extension direction of the electrode finger in which differs from the extension direction of the electrode finger in the remaining region of the overlap region, to the overlap region of the IDT.

The technique disclosed in Patent Document 1 increases the number of dummy electrode fingers, leading to bad area efficiency and increase in cost. The techniques disclosed in Patent Documents 2 and 3 do not sufficiently reduce undesired lateral-mode waves, and/or increase cost due to an additional fabrication step such as a step of forming a film.

SUMMARY OF THE INVENTION

According to an aspect of the present invention, there is provided an acoustic wave device including: a piezoelectric substrate; and an Interdigital Transducer (IDT) formed on the piezoelectric substrate, including electrode fingers, and exciting an acoustic wave, wherein an anisotropy coefficient is positive, an overlap region where the electrode fingers of the IDT overlap each other includes a center region located in a center of the overlap region in an extension direction of the electrode finger and an edge region located at an edge of the overlap region in the extension direction, the electrode finger in the center region and the electrode finger in the edge region are continuously formed, the electrode finger in the edge region is inclined with respect to the electrode finger in the center region so that a pitch in a width direction of the electrode finger in the edge region is greater than a pitch in a width direction of the electrode finger in the center region, and an angle between the width direction of the electrode finger in the center region and a crystal axis orientation of the piezoelectric substrate is less than an angle between the width direction of the electrode finger in the edge region and the crystal axis orientation.

According to another aspect of the present invention, there is provided an acoustic wave device including: a piezoelectric substrate; and an Interdigital Transducer (IDT) formed on the piezoelectric substrate, including electrode fingers, and exciting an acoustic wave, wherein an anisotropy coefficient is negative, an overlap region where the electrode fingers of the IDT overlap each other includes a center region located in a center of the overlap region in an extension direction of the electrode finger and edge regions located at both sides of the center region in the extension direction, the electrode finger in the center region and the electrode finger in the edge region are continuously formed, the electrode finger in the edge region is inclined with respect to the electrode finger in the center region so that a pitch in the width direction of the electrode finger in the edge region is less than a pitch in the width direction of the electrode finger in the center region, an angle between the width direction of the electrode finger in the center region and a crystal axis orientation of the piezoelectric substrate is less than an angle between the width direction of the electrode finger in the edge region and the crystal axis orientation, and the width directions of the electrode fingers in the edge regions located at both sides of the center region are parallel to each other.

DETAILED DESCRIPTION

Figure 1A:
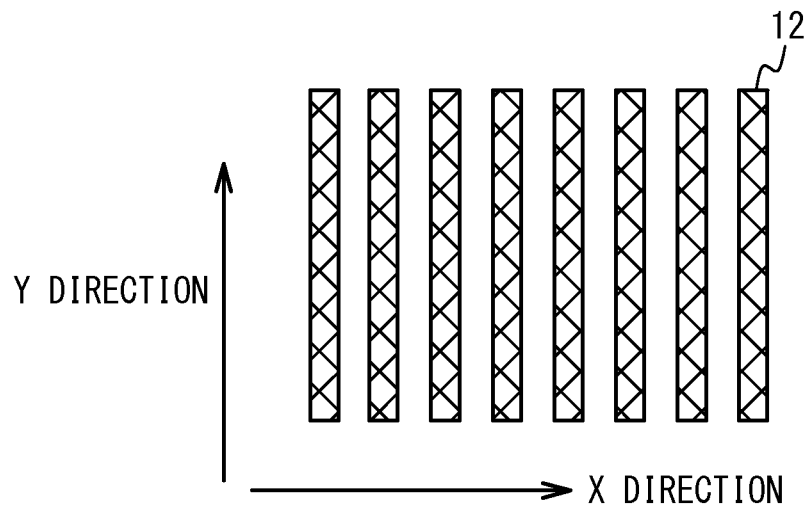
FIG. 1A is a plan view of arranged electrode fingers.
Figure 1B:
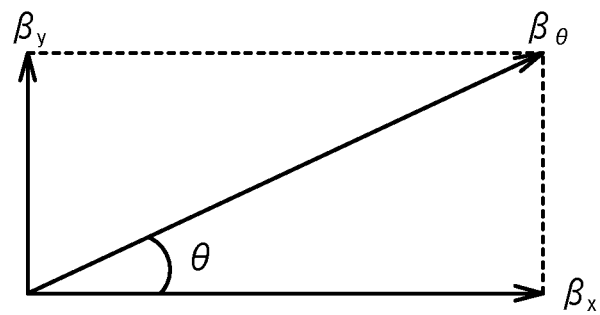
FIG. 1B is a plan view of a wave number.
Figure 1C:
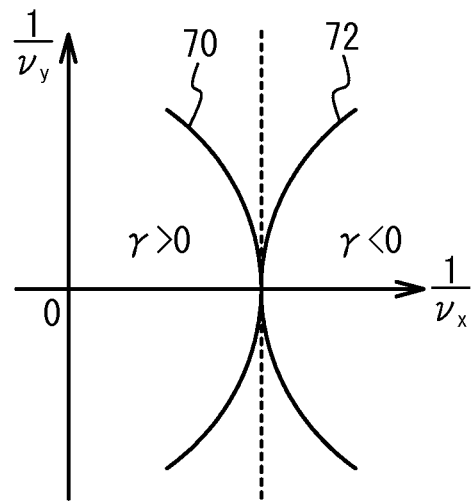
FIG. 1C is a diagram illustrating slowness.

A description will first be given of an anisotropy coefficient. FIG. 1A is a plan view of arranged electrode fingers, FIG. 1B is a plan view of a wave number, and FIG. 1C is a diagram illustrating slowness. The X direction and the Y direction in FIG. 1A through FIG. 1C are used to explain the anisotropy coefficient, and do not always correspond to the X-axis orientation and the Y-axis orientation of a piezoelectric substrate.

As illustrated in FIG. 1A, on a piezoelectric substrate, arranged are electrode fingers 12 in the X direction. A direction perpendicular to the X direction is the Y direction. Acoustic waves propagate in the X direction. As illustrated in FIG. 1B, an acoustic wave in the X direction has a wave number of $\beta_x$, and an acoustic wave in the Y direction has a wave number of $\beta_y$. When the wave number $\beta_\theta$ of an acoustic wave in a direction inclined at an angle θ from the X direction to the Y direction can be approximated by a parabola with respect to the angle θ, the wave number $\beta_\theta$ is represented by the following equation with use of an anisotropy coefficient γ.

$$\beta_x^2 + \gamma \cdot \beta_y^2 = \beta_\theta^2$$

FIG. 1C is a graph of the slowness $1/v_x$ of the phase velocity $v_x$ of the acoustic wave in the X direction versus the slowness $1/v_y$ of the phase velocity $v_y$ of the acoustic wave in the Y direction. A slowness surface 70 when the anisotropy coefficient γ is positive has a convex surface when viewed from the origin. Thus, the state of γ>0 is also referred to as a convex state. A slowness surface 72 when the anisotropy coefficient γ is negative has a concave surface when viewed from the origin. Thus, the state of γ<0 is also referred to as a concave state.

The anisotropy coefficient γ is determined by the material of the piezoelectric substrate 18, and the material and the film thickness of the electrode finger 12. For example, when the piezoelectric substrate 18 is a rotated Y-cut X-propagation lithium niobate substrate, the anisotropy coefficient γ is positive. When the piezoelectric substrate 18 is a rotated Y-cut X-propagation lithium tantalate substrate, the anisotropy coefficient γ is negative. When the piezoelectric substrate 18 is a rotated Y-cut X-propagation lithium tantalate substrate, and the electrode finger is made of a heavy material and has a large film thickness, the anisotropy coefficient γ is occasionally positive. For example, when the piezoelectric substrate is a 42°-rotated Y-cut X-propagation lithium tantalate substrate, and the electrode finger is made of copper and has a large film thickness, the anisotropy coefficient γ is positive.

Figure 2A:
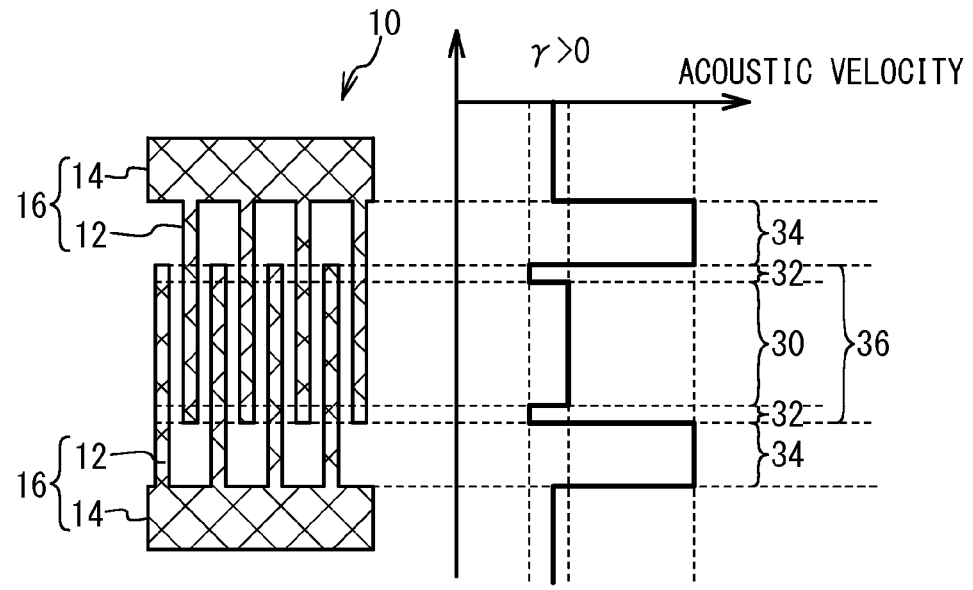
FIG. 2A and FIG. 2B are diagrams illustrating acoustic velocity in an IDT used to reduce undesired lateral-mode waves.
Figure 2B:
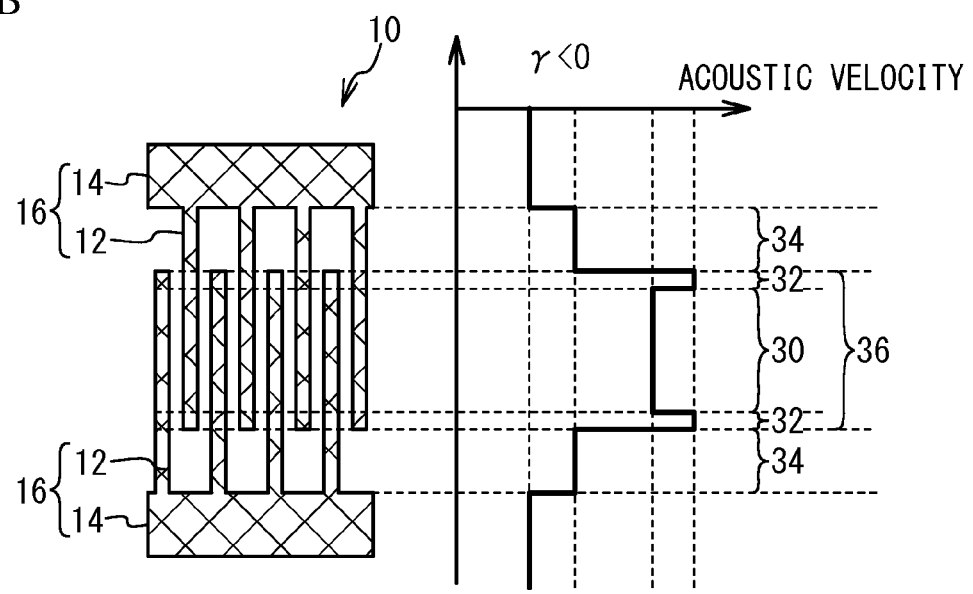

A description will next be given of a method of reducing undesired lateral-mode waves. FIG. 2A and FIG. 2B are diagrams illustrating acoustic velocity in an IDT used to reduce undesired lateral-mode waves. FIG. 2A corresponds to a case where the anisotropy coefficient γ is positive, and FIG. 2B corresponds to a case where the anisotropy coefficient γ is negative. As illustrated in the left parts of FIG. 2A and FIG. 2B, an IDT 10 includes two comb-shaped electrodes 16. The comb-shaped electrode 16 includes electrode fingers 12 and a bus bar 14. Two or more electrode fingers 12 are connected to the bus bar 14. A region where the electrode fingers 12 overlap each other is an overlap region 36. The overlap region 36 includes a center region 30 and edge regions 32. A region between the overlap region 36 and the bus bar 14 is a gap region 34.

As illustrated in the right part of FIG. 2A, when the anisotropy coefficient γ is positive, the acoustic velocity in the gap region 34 is adjusted to be greater than that in the overlap region 36. This enables to confine acoustic waves in the overlap region 36. The acoustic velocity in the edge region 32 is adjusted to be less than that in the center region 30. This enables to reduce undesired lateral-mode waves. As illustrated in the right part of FIG. 2B, when the anisotropy coefficient γ is negative, the acoustic velocity in the gap region 34 is adjusted to be less than that in the overlap region 36. This enables to confine acoustic waves in the overlap region 36. The acoustic velocity in the edge region 32 is adjusted to be greater than that in the center region 30. This enables to reduce undesired lateral-mode waves. The acoustic velocity may be adjusted by covering the electrode fingers 12 and the bus bars 14 in FIGS. 2A and 2B with a dielectric film or a metal film, but the illustration is omitted.

Figure 3A:
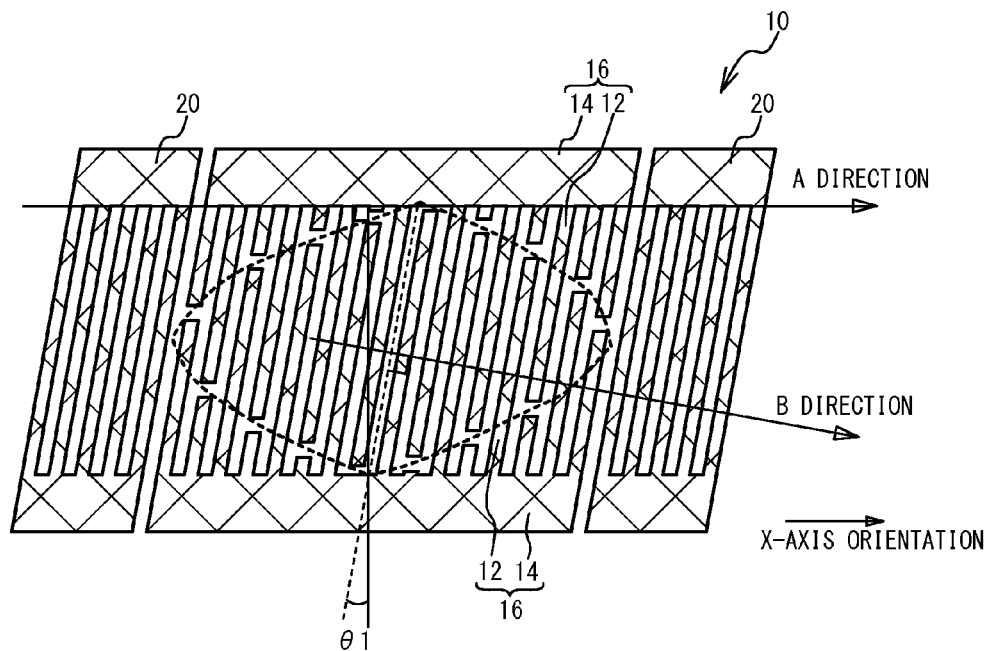
FIG. 3A is a plan view of a resonator in accordance with a first comparative example.
Figure 3B:
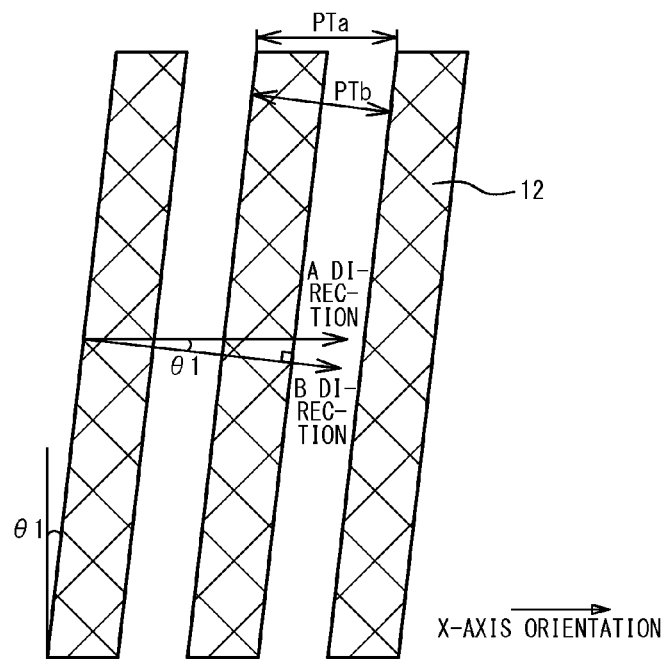
FIG. 3B is an enlarged view of electrode fingers.

A description will be given of a method of inclining the electrode fingers 12 to make the acoustic velocities in the center region 30 and the edge region 32 differ from each other. FIG. 3A is a plan view of a resonator in accordance with a first comparative example, and FIG. 3B is an enlarged view of electrode fingers. As illustrated in FIG. 3A and FIG. 3B, the first comparative example is an exemplary apodized resonator to exclude effects of undesired lateral-mode waves. The IDT 10 includes the comb-shaped electrodes 16, each including the electrode fingers 12 and the bus bar 14. Reflectors 20 are located at both sides of the IDT 10. The materials of the piezoelectric substrate and the electrodes are the same as those used in an experiment in a first embodiment described later. The IDT 10 includes 55 pairs of electrode fingers 12, has an aperture length (the length of the overlap region) of 35λ, and is an ArcCos-apodized IDT. The gaps of the electrode fingers 12 are indicated by a dashed line. The extension direction of the bus bar 14 is referred to as an A direction. In the first comparative example, the A direction corresponds to the X-axis orientation of the piezoelectric substrate. The primary mode of an acoustic wave propagates virtually in the A direction. As illustrated in FIG. 3A, the width direction of the electrode finger 12 (i.e., a direction perpendicular to the extension direction of the electrode finger 12) is inclined at an angle of θ1 with respect to a direction perpendicular to the A direction. This corresponds to a structure in which the width direction of the electrode finger 12 is inclined at an angle of θ1 with respect to a direction perpendicular to the A direction as illustrated in FIG. 3B. A direction perpendicular to the electrode finger 12 (i.e., the width direction of the electrode finger 12) is referred to as a B direction.

Figure 4A:
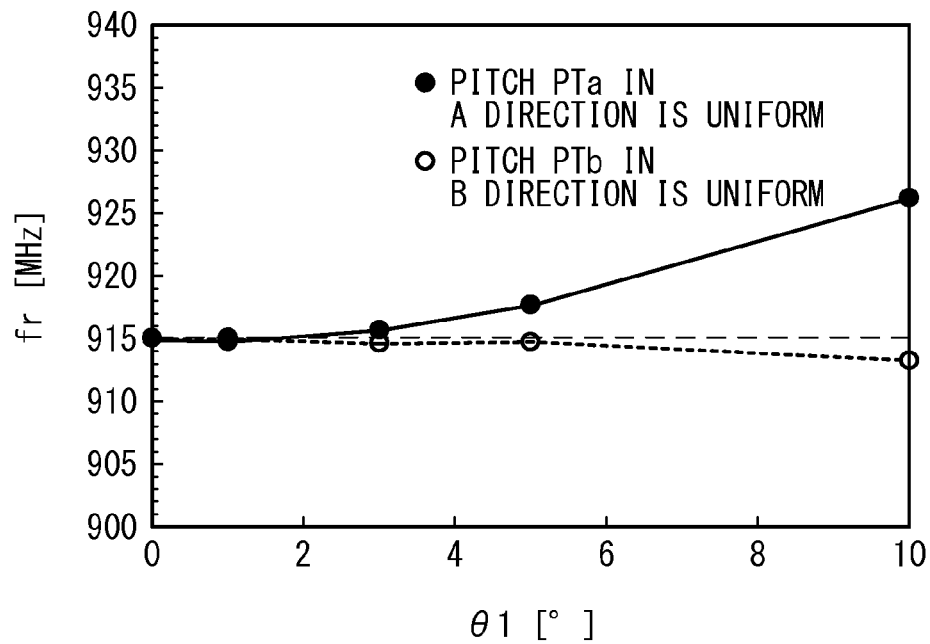
FIG. 4A is a graph of the inclination angle θ1 of the electrode finger in the first comparative example versus resonant frequency.
Figure 4B:
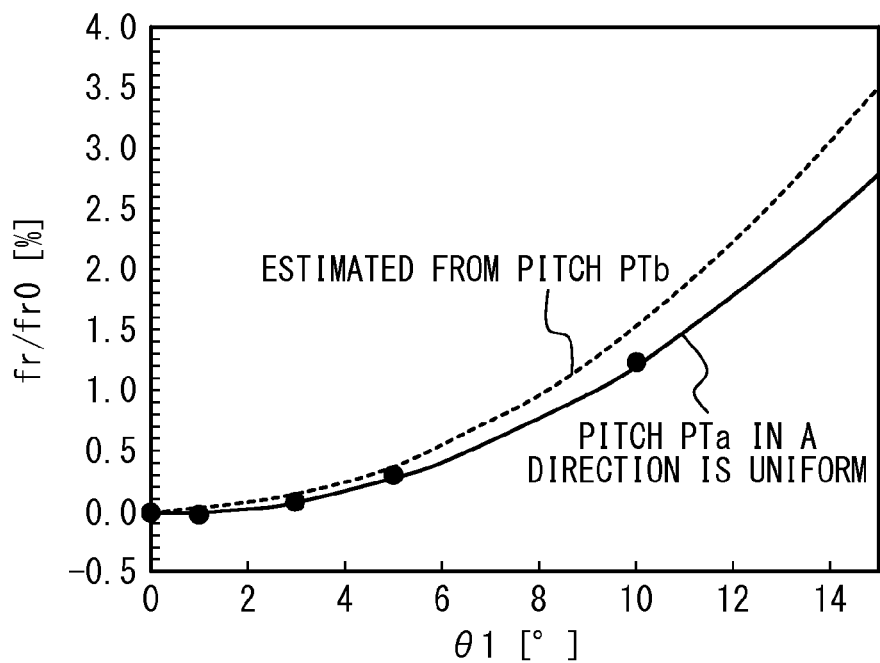
FIG. 4B is a graph of an angle θ1 versus normalized resonant frequency.

Resonators were fabricated to measure resonant frequency when a pitch PTa of the IDT 10 in the A direction is uniform and θ1 is varied and to measure resonant frequency when a pitch PTb of the IDT in the B direction is uniform and θ1 is varied. FIG. 4A is a graph of the inclination angle θ1 of the electrode finger in the first comparative example versus resonant frequency, and FIG. 4B is a graph of the angle θ1 versus normalized resonant frequency. Black circles exhibit experimental results when the pitch PTa in the A direction is uniform, and open circles exhibit experimental results when the pitch PTb in the B direction is uniform. As illustrated in FIG. 4A, when the pitch PTb in the B direction is uniform, the resonant frequency fr remains virtually unchanged. When the pitch PTa in the A direction is uniform, the resonant frequency fr increases. As illustrated in FIG. 3B, when the pitch PTa in the A direction is uniform and θ1 increases, the pitch PTb in the B direction decreases. This is considered to be the reason why the resonant frequency fr increases.

FIG. 4B is a graph of fr/fr0, which is calculated by normalizing the resonant frequency fr by resonant frequency fr0 of θ1=0, versus the angle θ1. Black circles exhibit experimental results when the pitch PTa in the A direction is uniform, and the solid line is an approximate curve. The dotted line exhibit fr/fr0 estimated from the pitch PTb in the B direction when the pitch PTa in the A direction is uniform and the angle θ1 is varied. As illustrated in FIG. 4B, the experimental results (solid line) accord closely with values estimated from the pitch PTb (dotted line). The above described fact reveals that the pitch PTb of the electrode finger in the B direction decreases when the pitch PTa of the electrode finger 12 in the A direction, which corresponds approximately to the propagation direction of the acoustic wave, is uniform and the electrode finger 12 is inclined. This increases the resonant frequency. The equivalent acoustic velocity in the A direction depends on the resonant frequency, and thus the acoustic velocity equivalently increases as the resonant frequency increases. As described above, the acoustic velocity is equivalently changed by inclining the electrode finger 12. Here, the reason why the solid line slightly shifts from the dotted line in FIG. 4B is because the surface acoustic wave obliquely propagates with respect to the IDT (i.e., $\beta_0 \neq \beta_\theta$) as explained in FIG. 1. As described above, the change of the combination of the materials of the substrate and the electrode changes the anisotropy coefficient (γ), thus changing the shift amount. Accordingly, when the combination of the materials is changed, the relation between the inclination angle θ and the resonant frequency is newly obtained.

Figure 5:
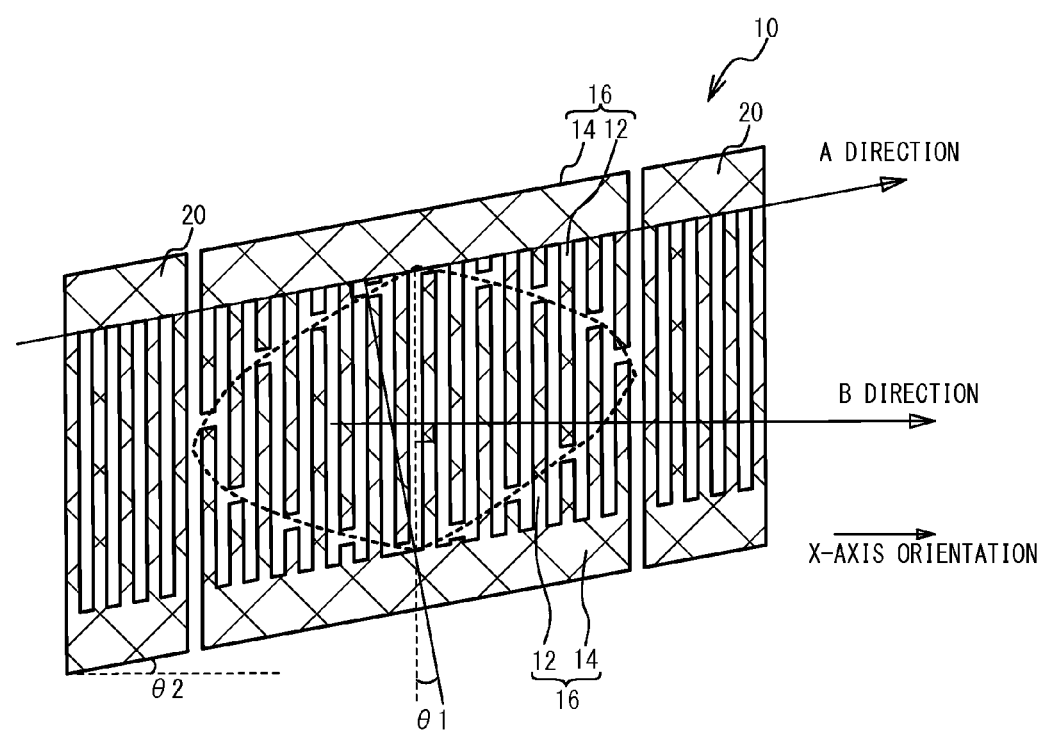
FIG. 5 is a plan view of a resonator in accordance with a second comparative example.

Next, considered are the extension direction of the electrode finger 12 and undesired SH-mode waves. FIG. 5 is a plan view of a resonator in accordance with a second comparative example. As illustrated in FIG. 5, the second comparative example is an exemplary apodized resonator. The materials of the piezoelectric substrate and the electrode are the same as those used in the experiment in the first embodiment described later. The IDT 10 includes 55 pairs of electrode fingers, has an aperture length of 35λ, and is an ArcCos-apodized IDT. The A direction, which corresponds to the extension direction of the bus bar 14, is inclined at an angle of θ2 from the X-axis orientation of the piezoelectric substrate 18. The extension direction of the electrode finger 12 is inclined at an angle of θ1 with respect to a direction perpendicular to the A direction. An experiment was conducted in which θ1 was 5° and θ2 was varied from −5° to 7.5°.

Figure 6A:
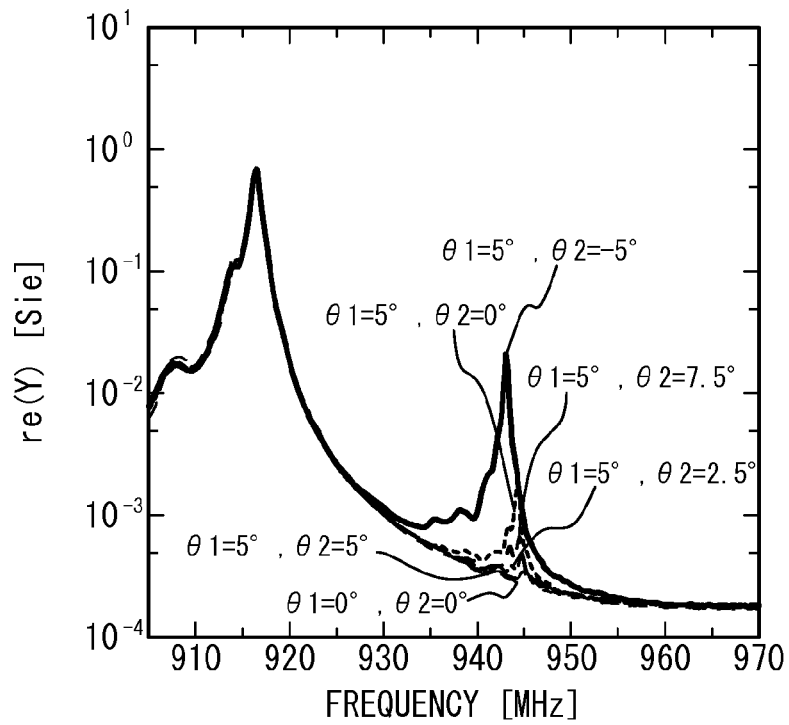
FIG. 6A is a graph of frequency of the resonator of the second comparative example versus a real component of admittance Y.
Figure 6B:
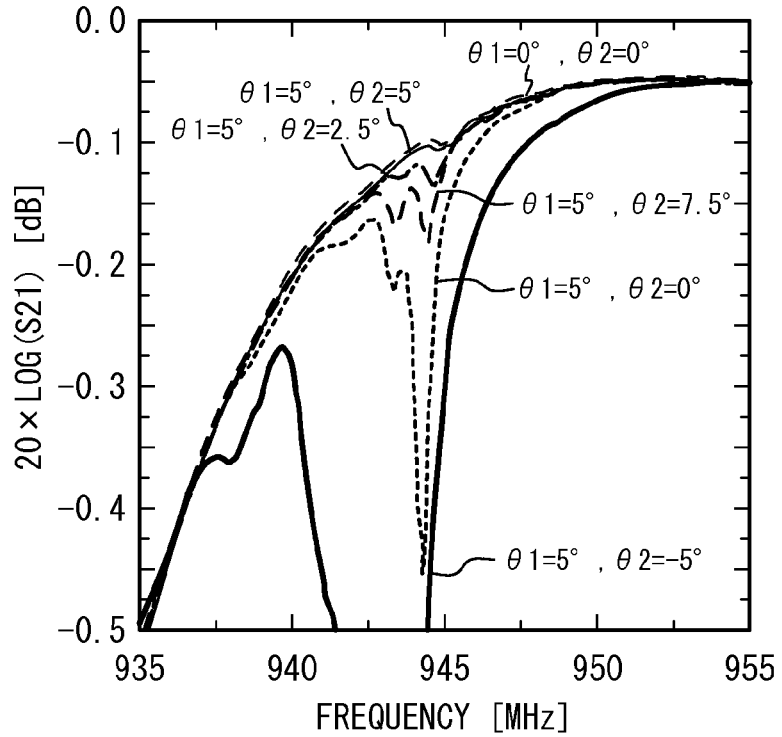
FIG. 6B is a graph of S21 when the resonator of the second comparative example is connected in parallel.

FIG. 6A is a graph of frequency of the resonator of the second comparative example versus a real component of admittance Y, and FIG. 6B is a graph of S21 when the resonator of the second comparative example was connected in parallel. A peak near 945 MHz corresponds to an undesired SH-mode wave. As illustrated in FIG. 6A and FIG. 6B, undesired SH-mode waves are hardly generated in the case of θ1=0° and θ2=0°. An undesired SH-mode wave is generated in the case of θ2=0° and θ1=5°. The peak due to an undesired SH-mode wave is further large in the case of θ1=5° and θ2=−5°. In the case of θ2=5°, the undesired SH-mode wave is reduced to approximately the same degree as that in the case of θ1=0° and θ2=0°. As described above, when θ1 is closely equal to θ2, undesired SH-mode waves are reduced. When the extension direction of the electrode finger 12 is perpendicular to the X-axis orientation, θ1 is equal to θ2. As described above, undesired SH-mode waves decrease as the angle between the width direction of the electrode finger 12 (the B direction) and the X-axis orientation decreases.

Considering the above described facts, a description will now be given of embodiments that reduce undesired lateral-mode waves and undesired SH-mode waves.

First Embodiment

Figure 7A:
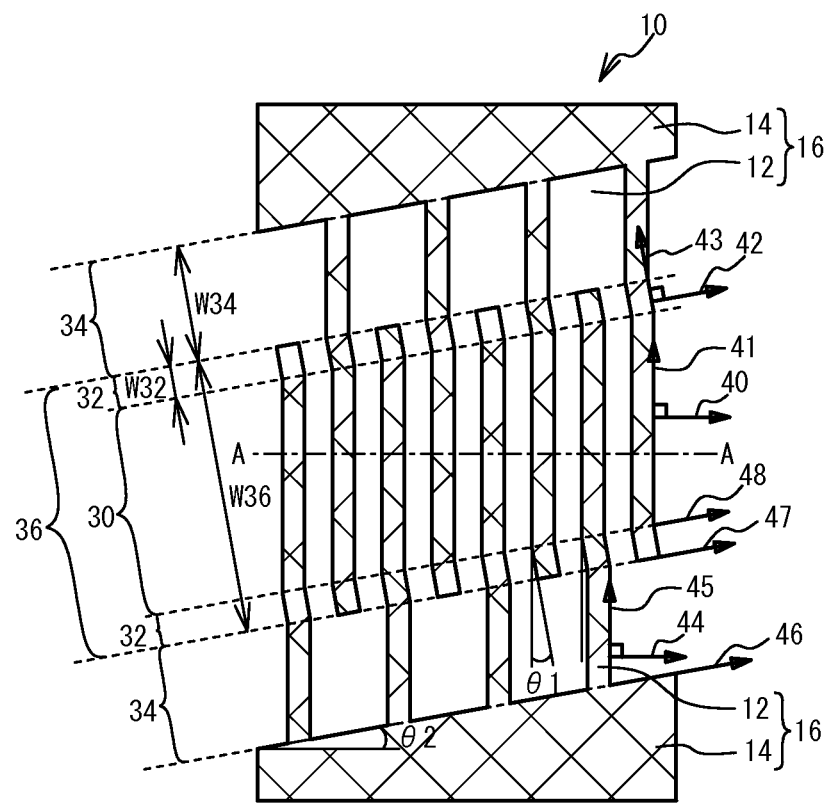
FIG. 7A is a plan view of a resonator in accordance with a first embodiment.
Figure 7B:
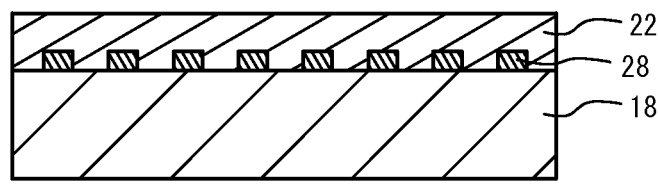
FIG. 7B is a cross-sectional view taken along line A-A in FIG. 7A.

The first embodiment describes a case where the anisotropy coefficient γ is positive. FIG. 7A is a plan view of a resonator in accordance with the first embodiment, and FIG. 7B is a cross-sectional view taken along line A-A in FIG. 7A. As illustrated in FIG. 7A, the IDT 10 includes the comb-shaped electrodes 16 facing each other. Each of the comb-shaped electrodes 16 includes two or more electrode fingers 12 and the bus bar 14. Between the bus bars 14, located are the overlap region 36 where the electrode fingers 12 overlap each other and the gap regions 34 between the overlap region 36 and the bus bars 14. The overlap region 36 includes the center region 30 and the edge regions 32. The center region 30 is located in the center of the overlap region 36 in the extension direction of the electrode finger 12 in the overlap region 36, and the edge regions 32 are located at both sides of the center region 30. The electrode fingers 12 in the center region 30 and the edge region 32 are continuously formed. The IDT 10 is formed on the piezoelectric substrate, and excites acoustic waves.

The X-axis orientation is parallel to the upper surface of the piezoelectric substrate. The extension direction of the electrode finger 12 in the center region 30 is referred to as a direction 41, and a direction perpendicular to the extension direction of the electrode finger 12 in the center region 30 (i.e., the width direction of the electrode finger 12) is referred to as a direction 40. The extension direction of the electrode finger 12 in the edge region 32 is referred to as a direction 43, and a direction perpendicular to the extension direction of the electrode finger 12 in the edge region 32 is referred to as a direction 42. The extension direction of the electrode finger 12 in the gap region 34 is referred to as a direction 45, and a direction perpendicular to the extension direction of the electrode finger 12 in the gap region 34 is referred to as a direction 44. The extension direction of the bus bar 14 is referred to as a direction 46, the extension direction of the boundary between the overlap region 36 and the gap region 34 is referred to as a direction 47, and the extension direction of the boundary between the center region 30 and the edge region 32 is referred to as a direction 48. The angle between the extension direction 41 of the electrode finger 12 in the center region 30 and the extension direction 43 of the electrode finger 12 in the edge region 32 is an angle of θ1. The angle between the directions 40 and 42 is an angle of θ1. The angle between the extension direction 46 of the bus bar 14 and the X-axis orientation is an angle of θ2. The directions 47 and 48 are parallel to the direction 46. The propagation direction of an acoustic wave in a primary mode corresponds approximately to the direction 46. The extension direction 45 of the electrode finger 12 in the gap region 34 is parallel to the direction 41. The width direction 40 of the electrode finger 12 in the center region 30 corresponds approximately to the X-axis orientation.

As illustrated in FIG. 7B, a metal film 28 is formed on the piezoelectric substrate 18. The metal film 28 includes the electrode fingers 12 and the bus bars 14. A dielectric film 22 is formed to cover the metal film 28. The piezoelectric substrate 18 is, for example, a Y-cut X-propagation lithium niobate substrate. The metal film 28 is, for example, a copper film. The dielectric film 22 is, for example, a silicon oxide film. The dielectric film 22 is a film for improving temperature characteristics.

Figure 8:
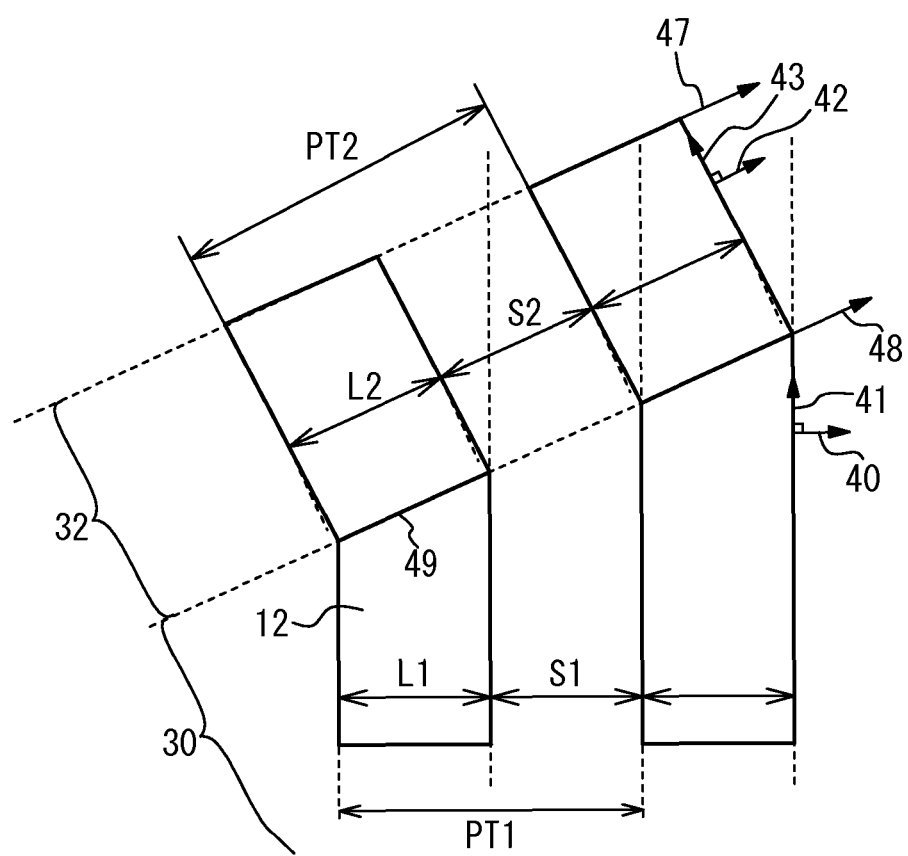
FIG. 8 is an enlarged view of electrode fingers in an edge region in the first embodiment.

FIG. 8 is an enlarged view of the electrode fingers in the edge region in the first embodiment. As illustrated in FIG. 8, in the first embodiment, the extension direction 47 of the boundary between the edge region 32 and the gap region 34 is parallel to the extension direction 48 of the boundary between the edge region 32 and the center region 30. This structure makes the propagation direction of an acoustic wave in a primary mode correspond approximately to the directions 47 and 48. A pitch PT2 in the width direction 42 of the electrode finger 12 in the edge region 32 is greater than a pitch PT1 in the width direction 40 of the electrode finger 12 in the center region 30. This structure makes the resonant frequency in the edge region 32 less than the resonant frequency in the center region 30. Thus, the acoustic velocity in the edge region 32 is equivalently less than the acoustic velocity in the center region 30. The width of the electrode finger 12 in the center region 30 in the direction 40 is represented by L1, and the distance between the electrode fingers 12 in the center region 30 is represented by S1. The width of the electrode finger 12 in the edge region 32 in the directions 47 and 48 is represented by L2, and the distance between the electrode fingers 12 in the edge region 32 is represented by S2. The width L1 is equal to the width L2, and the distance S1 is equal to the distance S2. Thus, the duty ratio L1/(L1+S1) is equal to the duty ratio L2/(L2+S2).

Figure 9:
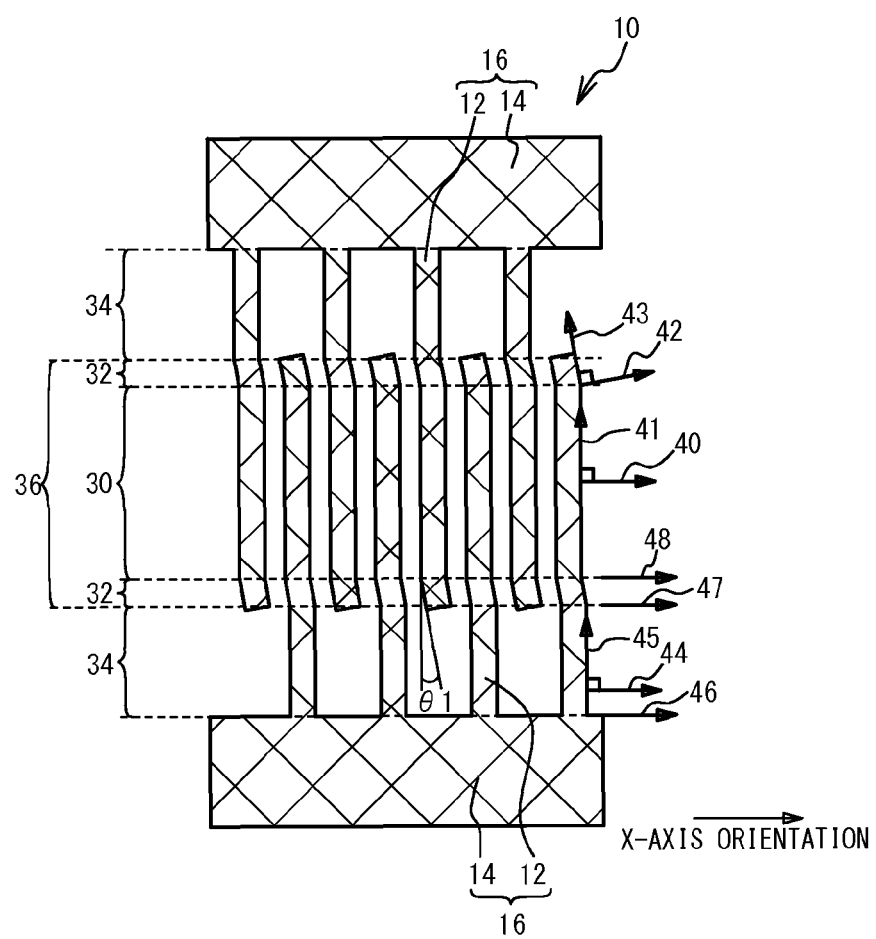
FIG. 9 is a plan view of a resonator in accordance with a third comparative example.

FIG. 9 is a plan view of a resonator in accordance with a third comparative example. As illustrated in FIG. 9, the extension direction 43 of the electrode finger 12 in the edge region 32 is inclined at an angle of θ1 from the extension direction 41 of the electrode finger 12 in the center region 30. The extension direction 46 of the bus bar 14 is parallel to the X-axis orientation. The directions 40, 47, 48 are parallel to the direction 46, and acoustic waves propagate virtually in the direction 46.

Figure 10A:
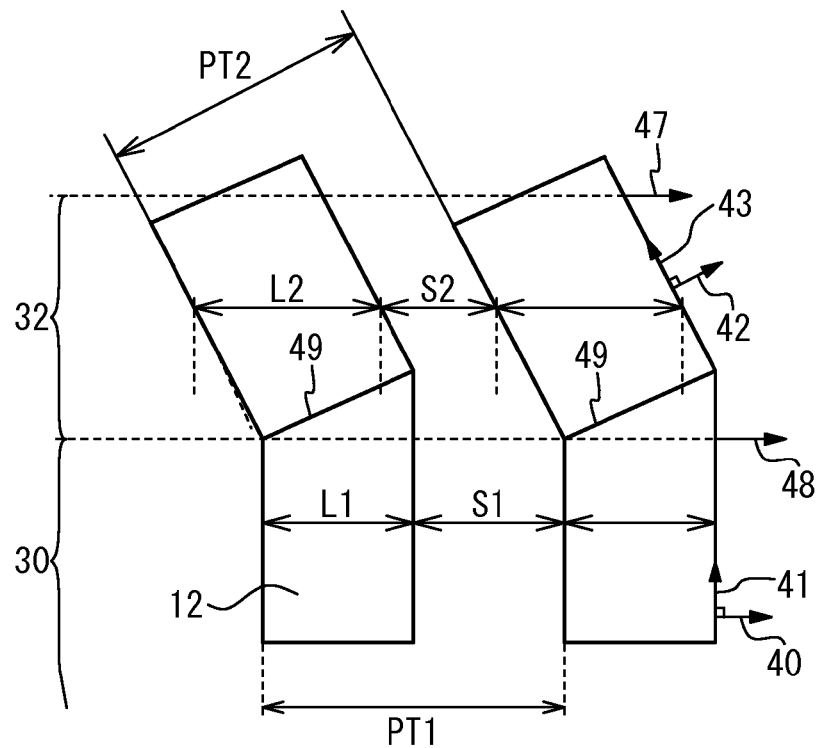
FIG. 10A and FIG. 10B are enlarged views of electrode fingers in the edge region in the third comparative example.
Figure 10B:
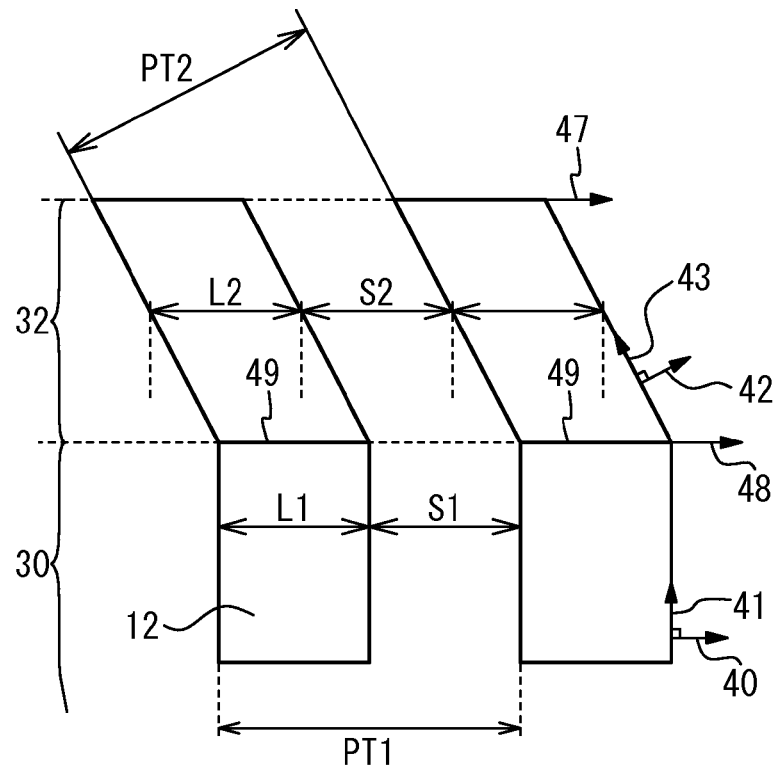

FIG. 10A and FIG. 10B are enlarged views of the electrode fingers in the edge region in the third comparative example. As illustrated in FIG. 10A and FIG. 10B, in the third comparative example, the pitch PT2 in the width direction 42 of the electrode finger 12 in the edge region 32 is less than the pitch PT1 in the width direction 40 of the electrode finger 12 in the center region 30. This is because the third comparative example makes the directions 47 and 48 parallel to the width direction 40 of the electrode finger 12 in the center region 30 and inclines the width direction 42 of the electrode finger 12 in the edge region 32 with respect to the direction 40 as illustrated in FIG. 10A and FIG. 10B while the first embodiment makes the directions 47 and 48 parallel to the width direction 42 of the electrode finger 12 in the edge region 32 and inclines the width direction 40 of the electrode finger 12 in the center region 30 with respect to the direction 42 as illustrated in FIG. 8.

In FIG. 10A, the duty ratio L2/(L2+S2) is greater than the duty ratio L1/(L1+S1). In FIG. 10B, the duty ratio L2/(L2+S2) is equal to the duty ratio L1/(L1+S1). As illustrated in FIG. 8 and FIG. 10B, when the duty ratio in the edge region 32 is equal to the duty ratio in the center region 30, the resonator is easily designed by appropriating the design of a normal type resonator such as a resonator illustrated in FIG. 11 described later. On the other hand, when the duty ratio in the edge region 32 differs from the duty ratio in the center region 30, designing the resonator is difficult because the design of the normal type resonator having a uniform duty ratio cannot be appropriated.

When FIG. 8 is compared to FIG. 10A, a boundary 49 between the edge region 32 and the center region 30 of each electrode finger 12 is parallel to the direction 48 of the boundary between the edge region 32 and the center region 30 in FIG. 8. This structure enables to determinately define the acoustic velocity near the boundary 49. On the other hand, the boundary 49 is not parallel to the direction 48 in FIG. 10A, and thus different acoustic velocities coexist near the boundary 49. This is applicable to the boundary between the edge region 32 and the gap region 34. When the acoustic velocity is determinately defined, the propagation mode can be controlled by a scalar potential method or the like. Thus, the acoustic wave device can be easily designed. Coexistence of different acoustic velocities makes the control of the propagation mode complicating, and complicates the design of the acoustic wave device.

Figure 17A:
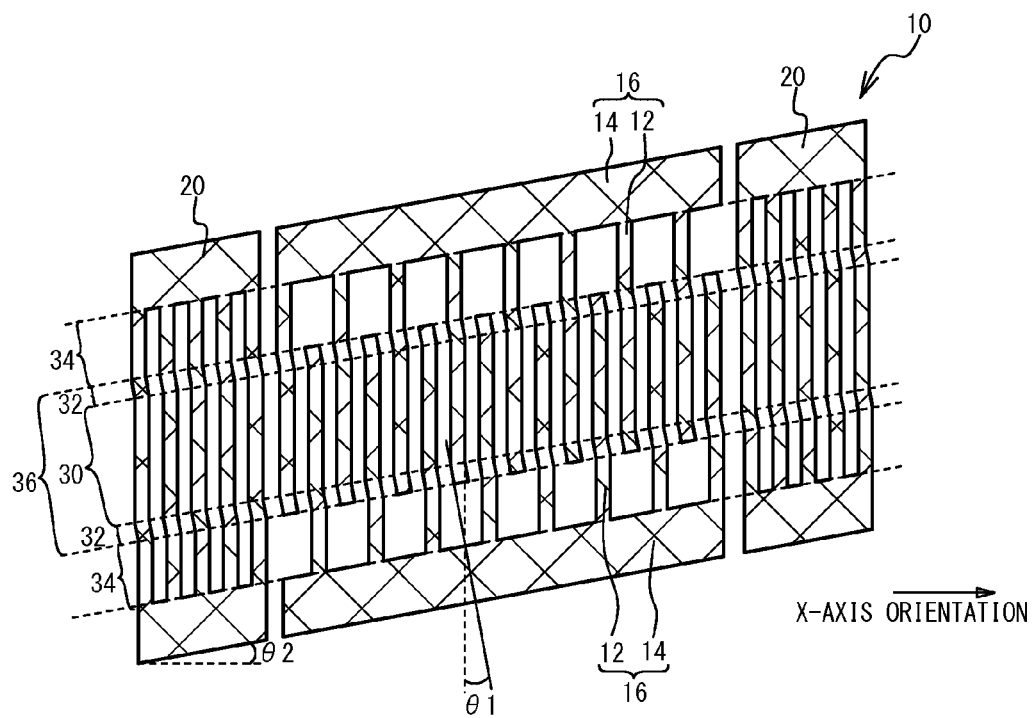
FIG. 17A and FIG. 17B are plan views of the resonators in accordance with the first embodiment and the first variation of the first embodiment, respectively.

The resonance characteristics of the resonator of the first embodiment were measured. The experimental conditions were as follows. The fabricated resonator included resonators at both sides of an IDT as illustrated in FIG. 17A described later.

Piezoelectric substrate 18: 127.86°-rotated Y-cut X-propagation LiNbO$_3$ substrate Metal film 28: material copper, film thickness 0.06λ

Dielectric film 22: material silicon oxide, film thickness 0.27λ

Number of pairs in the IDT: 100 pairs
Number of reflectors: 20
λ in the IDT: 3.84 μm
Width W36 of the overlap region 36 in the IDT: 76.8 μm
Duty ratio in the IDT: 50%
Duty ratio in the reflector: 50%
Width W32 of the edge region 32: 0.6λ
Width W34 of the gap region 34: 2.5λ
Angle θ1: 8.5°
Angle θ2: 8.5°

Here, λ is the wavelength of an acoustic wave in a primary mode, and corresponds to λ in the IDT. The width W36 of the overlap region 36, the width W32 of the edge region 32, and the width W34 of the gap region 34 are determined by directions perpendicular to the directions 46 through 48, respectively as illustrated in FIG. 7A.

Figure 11:
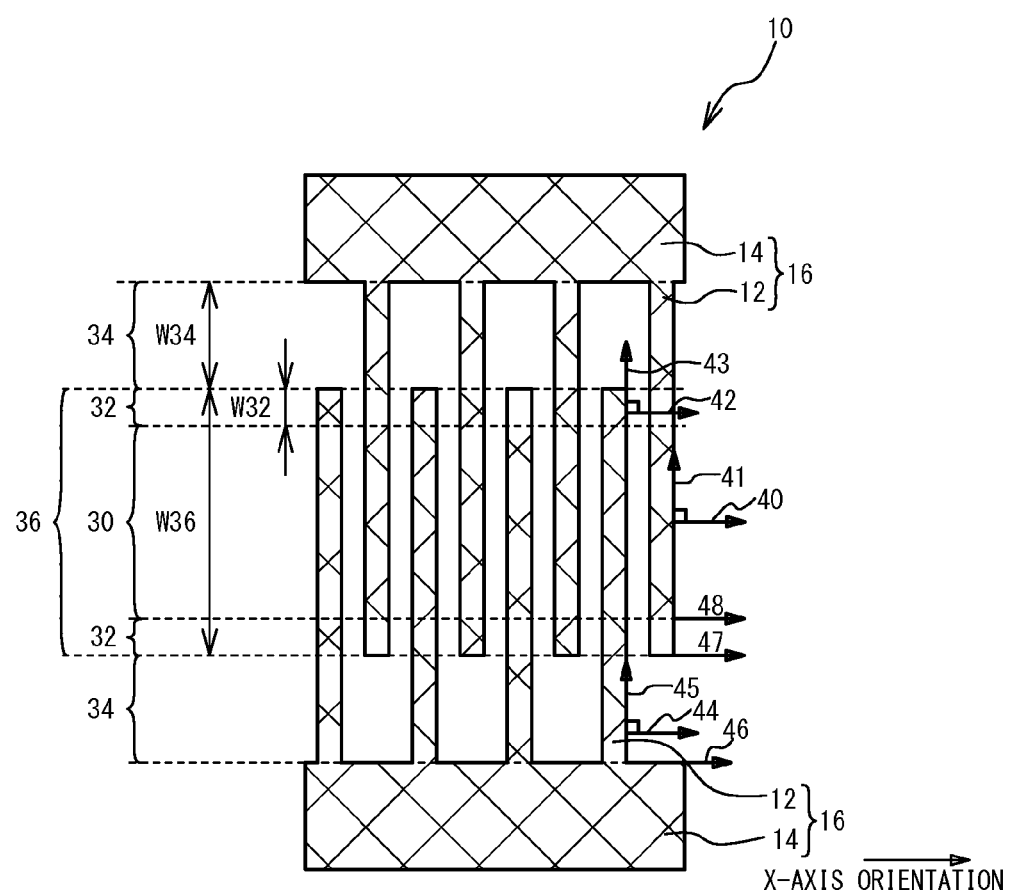
FIG. 11 is a plan view of a resonator in accordance with a fourth comparative example.

FIG. 11 is a plan view of a resonator in accordance with a fourth comparative example. In the fourth comparative example, the width directions 40, 42, and 44 of the electrode finger 12, the extension direction 46 of the bus bar 14, and the extension directions 47 and 48 of the boundaries are parallel to each other. The angles θ1 and θ2 are 0°. Other structures are the same as those of the first embodiment, and thus the description is omitted.

Figure 12A:
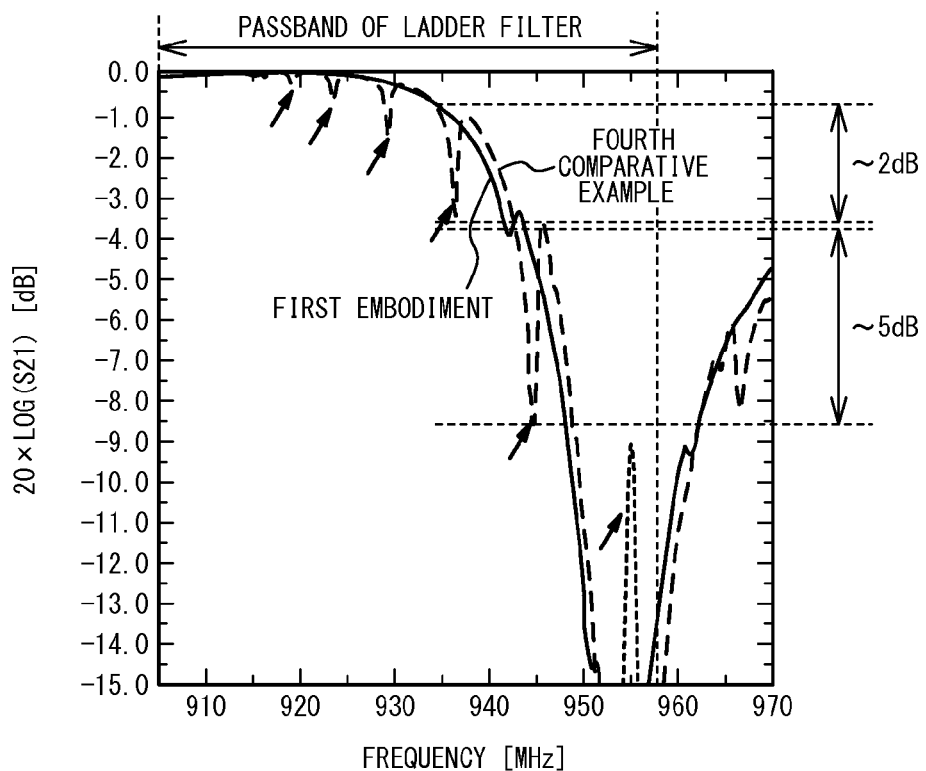
FIG. 12A and FIG. 12B are graphs of the pass characteristics of the resonators in accordance with the first embodiment and the fourth comparative example.
Figure 12B:
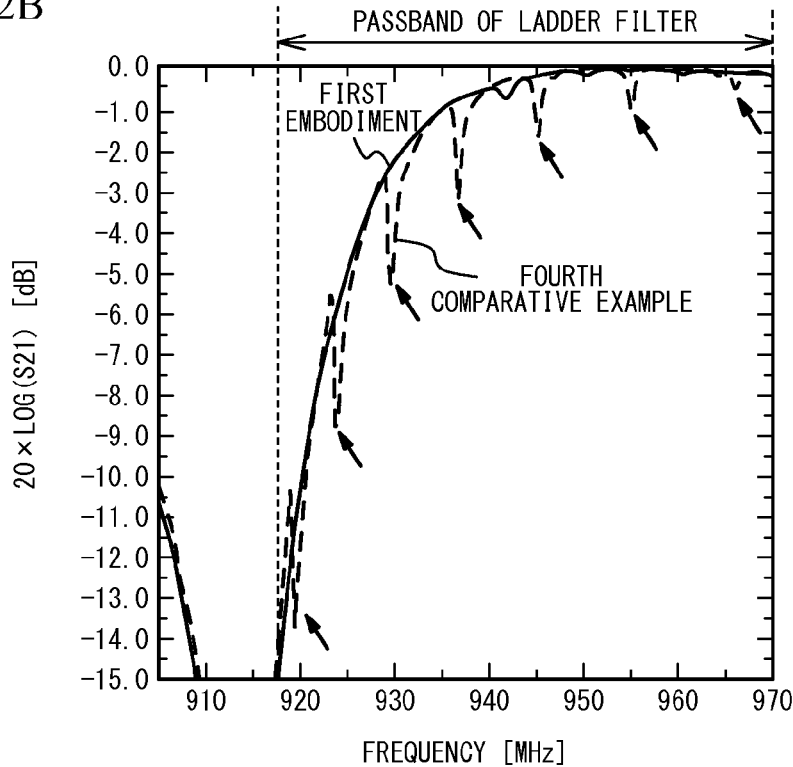

FIG. 12A and FIG. 12B are graphs of the pass characteristics of the resonators of the first embodiment and the fourth comparative example. FIG. 12A exhibits the pass characteristics when the resonator is connected as a series resonator of a ladder filter by the magnitude of the logarithm of the square of the absolute value of S21, and FIG. 12B exhibits the pass characteristics when the resonator is connected as a parallel of the ladder filter by the magnitude of the logarithm of the square of the absolute value of S21. As illustrated in FIG. 12A, in the fourth comparative example, responses due to undesired low-order lateral-mode waves are observed at frequencies corresponding to the passband of the ladder filter as indicated by arrows. The magnitude of the response ranges from 2 dB to 5 dB. On the other hand, in the first embodiment, undesired lateral-mode waves are reduced. As illustrated in FIG. 12B, in the fourth comparative example, responses due to undesired high-order lateral-mode waves are observed at frequencies corresponding to the passband of the ladder filter. In the first embodiment, undesired lateral-mode waves are reduced. The reason why the first embodiment reduces undesired lateral-mode waves is because the acoustic velocity in the edge region 32 is less than the acoustic velocity in the center region 30 by approximately 1.5% in the first embodiment. A simulation was conducted under the above described experimental conditions. The coupling coefficient of Rayleigh wave is high when Y-cut rotation is in the range of 120° to 140°, and the Rayleigh wave becomes a primary surface acoustic wave. Additionally, a leaky wave in an SH mode has a low coupling coefficient, thus becoming undesired waves.

Figure 13A:
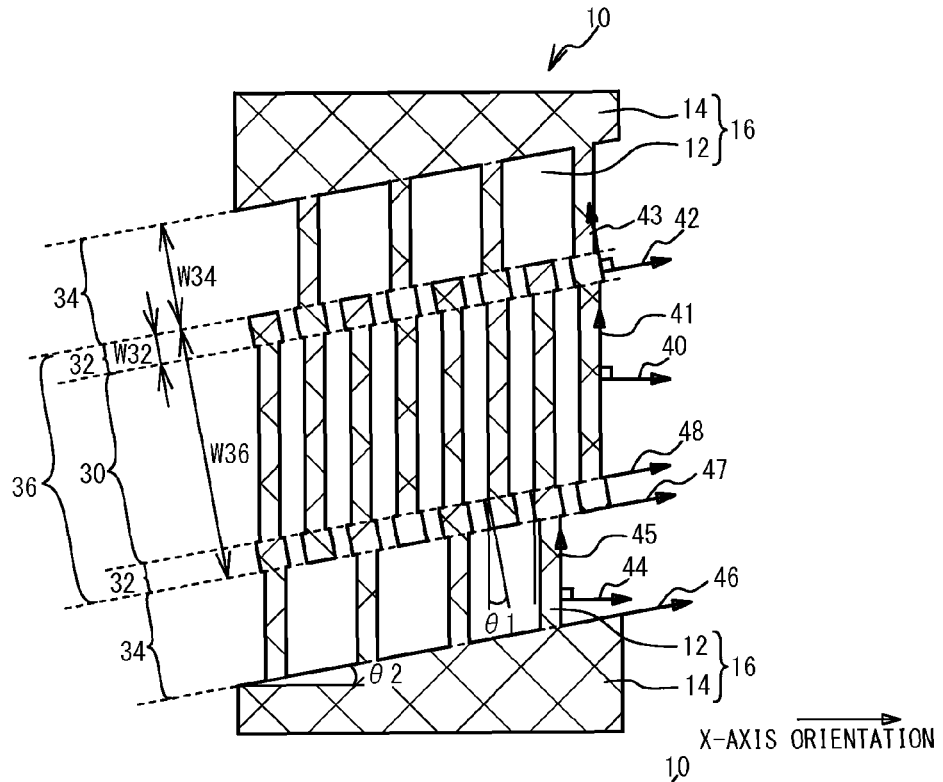
FIG. 13A and FIG. 13B are plan views of resonators in accordance with first and second variations of the first embodiment, respectively.
Figure 13B:
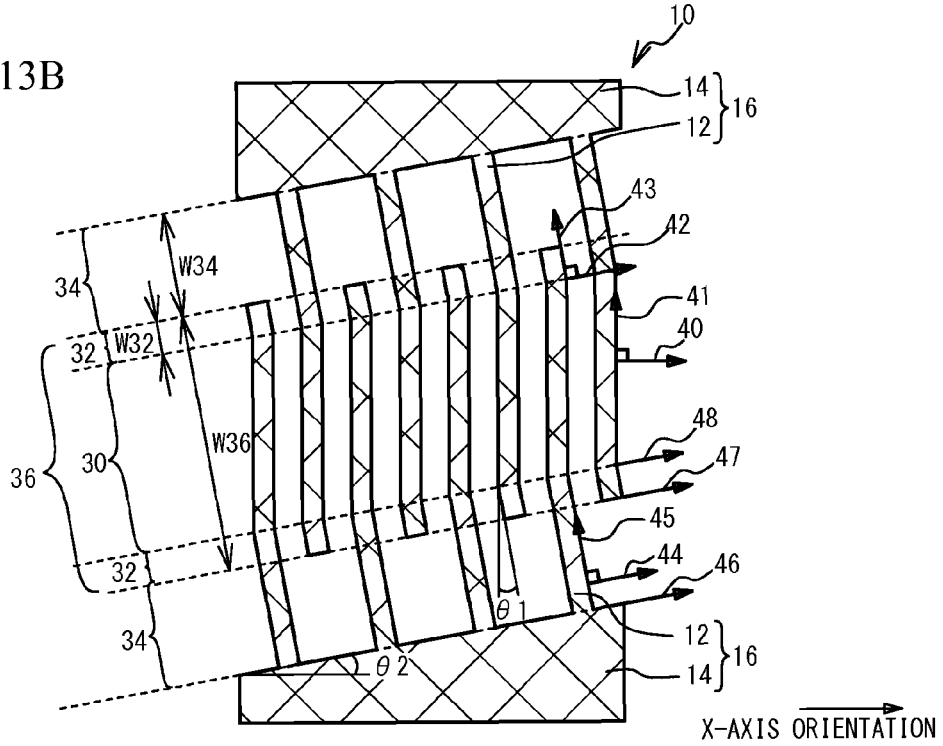

FIG. 13A and FIG. 13B are plan views of resonators in accordance with first and second variations of the first embodiment. As illustrated in FIG. 13A, in the first variation of the first embodiment, the width of the electrode finger 12 in the edge region 32 is greater than that in the center region 30. Other structures are the same as those of the first embodiment, and thus the description is omitted. In the first variation of the first embodiment, the electrode finger 12 in the edge region 32 has a large width, thus the acoustic velocity in the edge region 32 is made to be less than that of the first embodiment.

As illustrated in FIG. 13B, in the second variation of the first embodiment, the width direction 44 of the electrode finger 12 in the gap region 34 is parallel to the directions 46 through 48. As described above, the direction 44 is freely selected. The acoustic velocity in the gap region 34 of the first embodiment is greater than that of the second variation of the first embodiment. Thus, to confine acoustic waves in the overlap region 36, the first embodiment is more preferable than the second variation of the first embodiment.

Figure 14A:
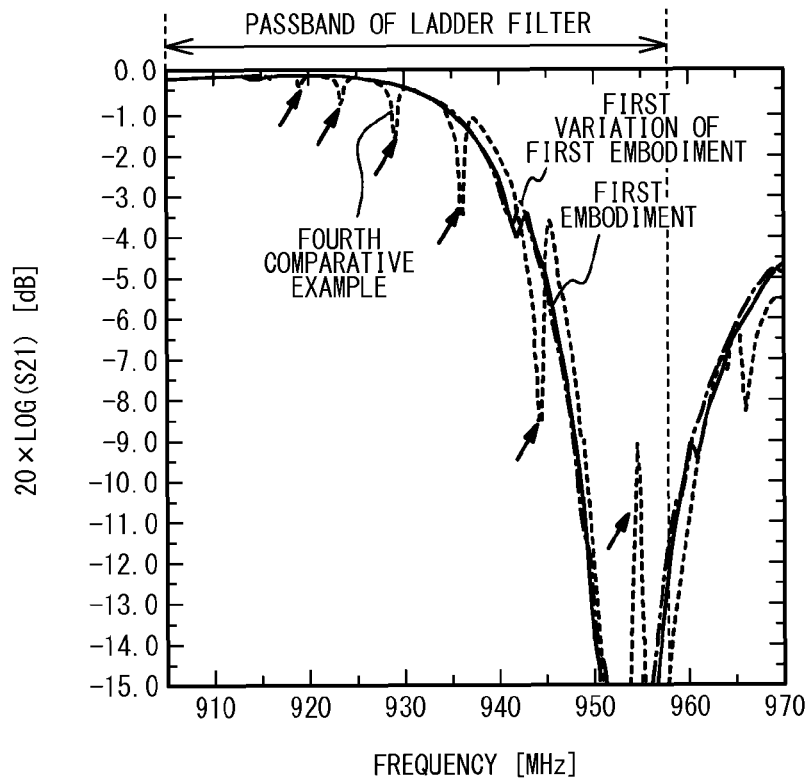
FIG. 14A and FIG. 14B are graphs of the pass characteristics of the resonators of the first embodiment, the first variation of the first embodiment, and the fourth comparative example.
Figure 14B:
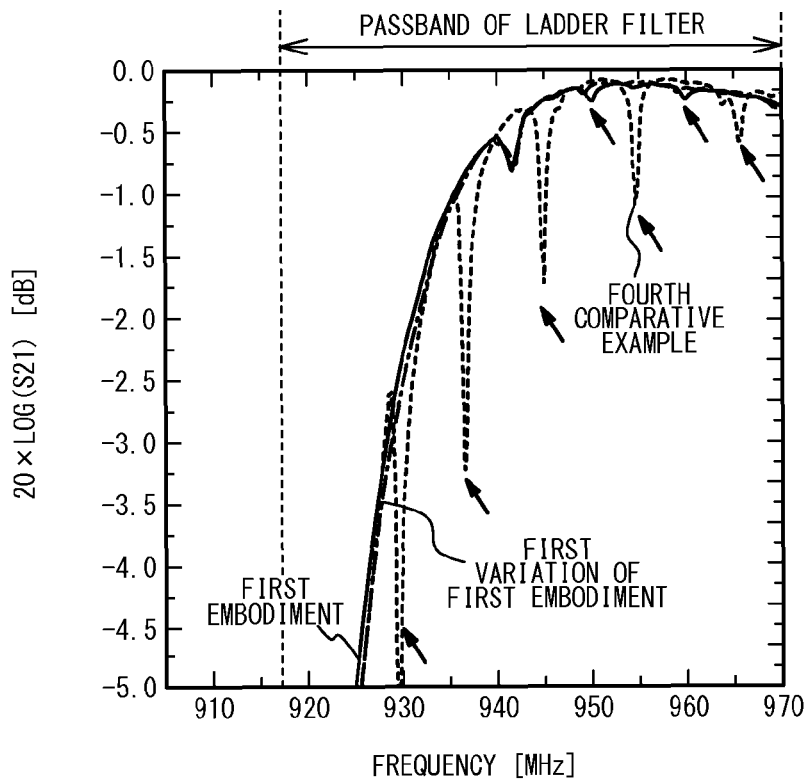

The pass characteristics of the first variation of the first embodiment were measured. The duty ratio in the edge region 32 was adjusted to be 60%. Other experimental conditions were the same as those of the first embodiment. FIG. 14A and FIG. 14B are graphs of the pass characteristics of the resonators of the first embodiment, the first variation of the first embodiment, and the fourth comparative example. FIG. 14A is a graph of the pass characteristics when the resonator is connected as a series resonator of a ladder filter, and FIG. 14B is a graph of the pass characteristics when the resonator is connected as a parallel resonator of the ladder filter. As illustrated in FIG. 14A and FIG. 14B, the first variation of the first embodiment reduces undesired lateral-mode waves compared to the first embodiment. This is because the acoustic velocity in the edge region 32 of the first variation of the first embodiment is less than that of the first embodiment.

Figure 15:
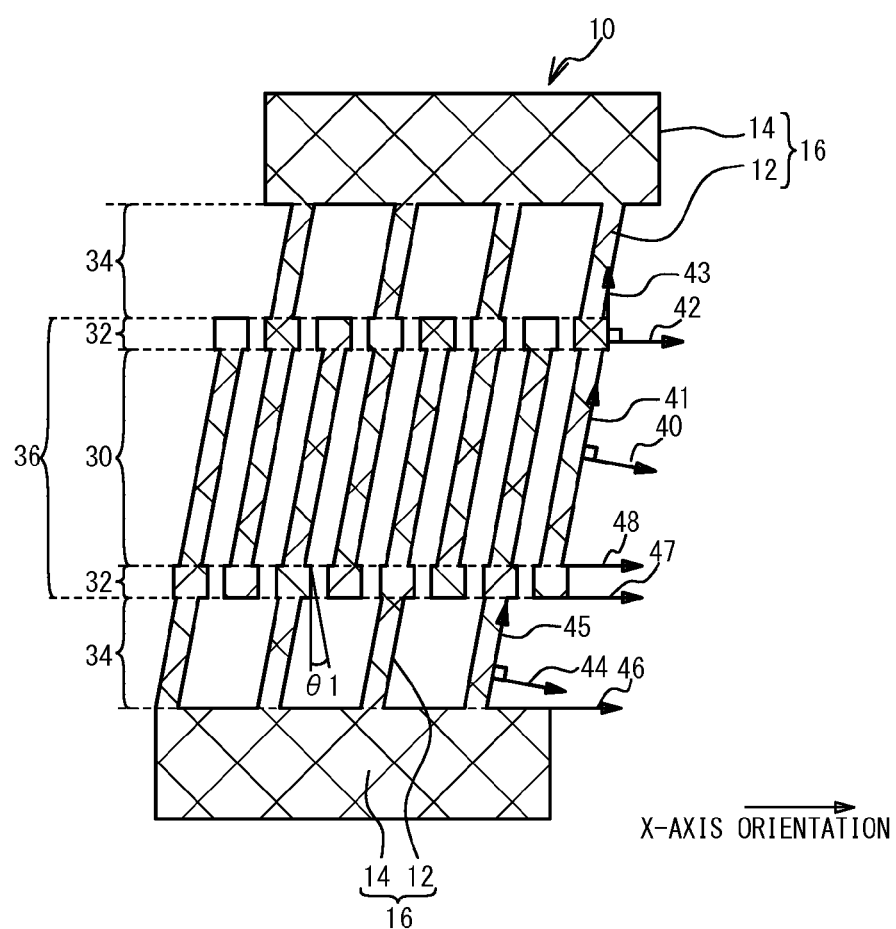
FIG. 15 is a plan view of a resonator in accordance with a fifth comparative example.

FIG. 15 is a plan view of a resonator in accordance with a fifth comparative example. As illustrated in FIG. 15, in the fifth comparative example, the angle θ1 is 5° and the angle θ2 is 0°. Thus, the directions 46 through 48 are parallel to the X-axis orientation. The width direction 42 of the electrode finger 12 in the edge region 32 is parallel to the X-axis orientation. The width direction 40 of the electrode finger 12 in the center region 30 is inclined at an angle of θ1 with respect to the X-axis orientation. Other structures are the same as those of the first variation of the first embodiment, and thus the description is omitted. The pass characteristics of the fifth comparative example were measured. The experimental conditions differ from those of the first variation of the first embodiment in that the angle θ2 was 0°.

Figure 16A:
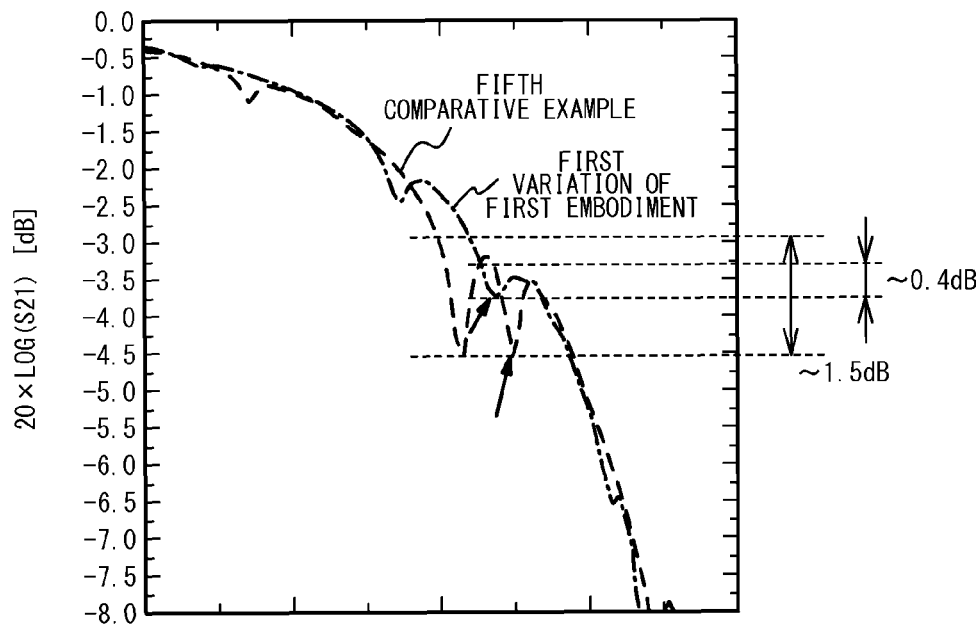
FIG. 16A and FIG. 16B are graphs of the pass characteristics of the resonators of the first variation of the first embodiment and the fifth comparative example.
Figure 16B:
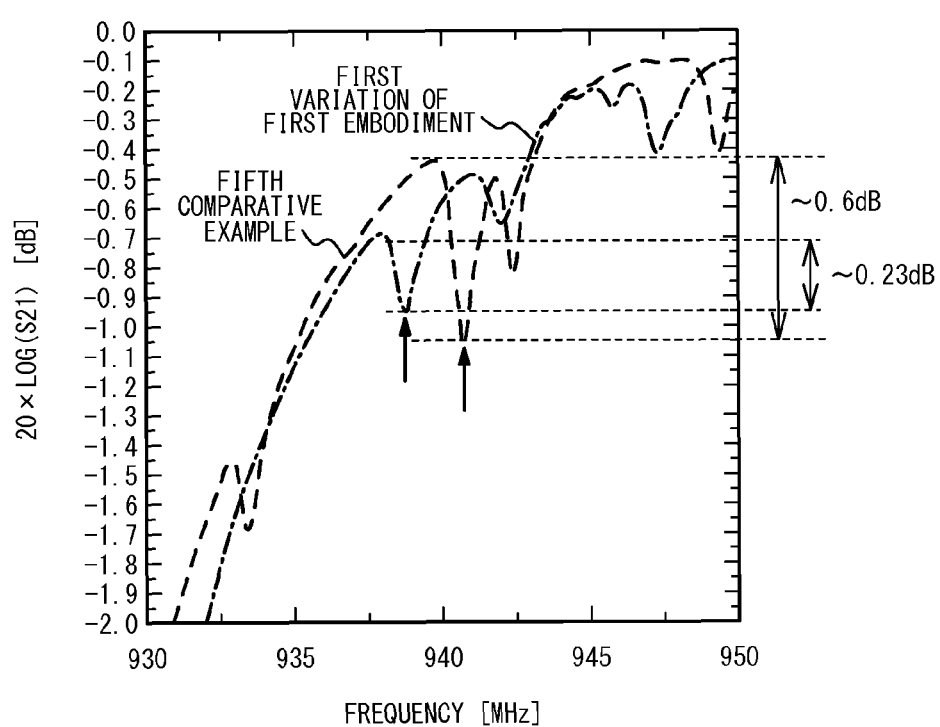

FIG. 16A and FIG. 16B are graphs of the pass characteristics of the resonators of the first variation of the first embodiment and the fifth comparative example. FIG. 16A is an enlarged view of the pass characteristics when the resonator is connected as a series resonator of a ladder filter, and FIG. 16B is an enlarged view of the pass characteristics when the resonator is connected as a parallel resonator of the ladder filter. Arrows indicate undesired SH-mode waves. As illustrated in FIG. 16A, the magnitude of the undesired SH-mode wave is 1.5 dB in the fifth comparative example, and is 0.4 dB in the first variation of the first embodiment. As illustrated in FIG. 16B, the magnitude of the undesired SH-mode wave is 0.6 dB in the fifth comparative example, and is 0.23 dB in the first variation of the first embodiment. As described above, the first variation of the first embodiment reduces undesired lateral-mode waves compared to the fifth comparative example. This is because the width direction of the electrode finger 12 in the center region 30 in the first variation of the first embodiment is closer to the X-axis orientation than that in the fifth comparative example is.

Figure 17B:
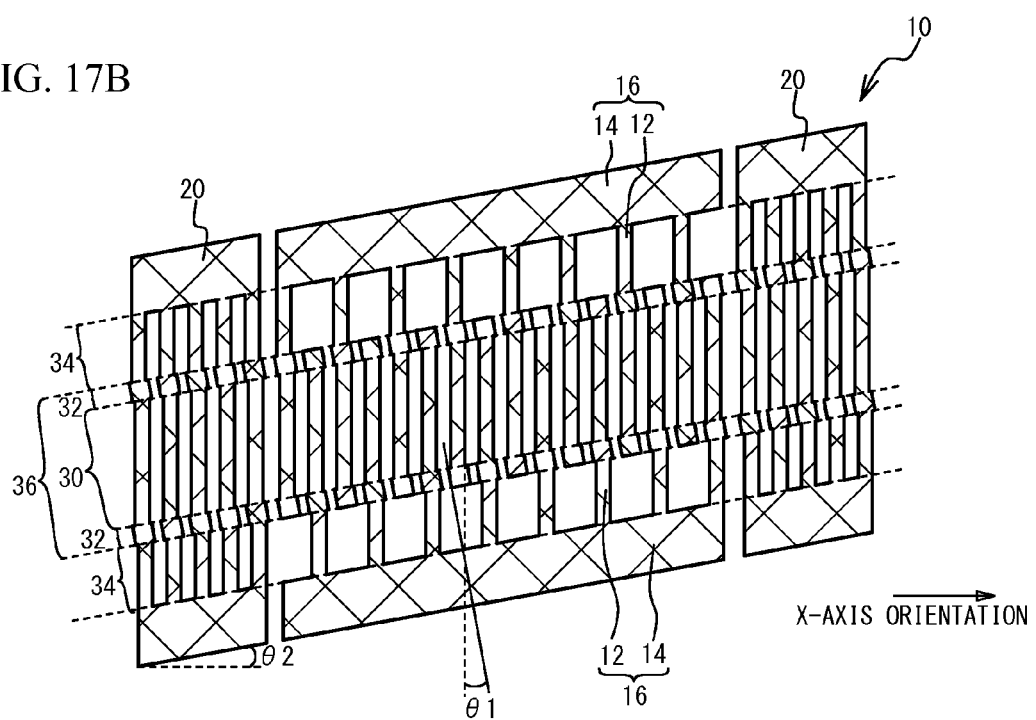

FIG. 17A and FIG. 17B are plan views of the resonators in accordance with the first embodiment and the first variation of the first embodiment, respectively. As illustrated in FIG. 17A and FIG. 17B, each of the resonators of the first embodiment and the first variation of the first embodiment may include the reflectors 20 at both sides of the IDT 10. In the reflector 20, the electrode finger in the edge region 32 is inclined at an angle of θ1 with respect to the electrode finger in the center region 30 as with in the IDT 10. The reflector 20 is a short-circuited grating, and both ends of the electrode finger of the reflector 20 are connected to the bus bar. Other structures are the same as those illustrated in FIG. 7A and FIG. 13A, and thus the description is omitted.

Figure 18A:
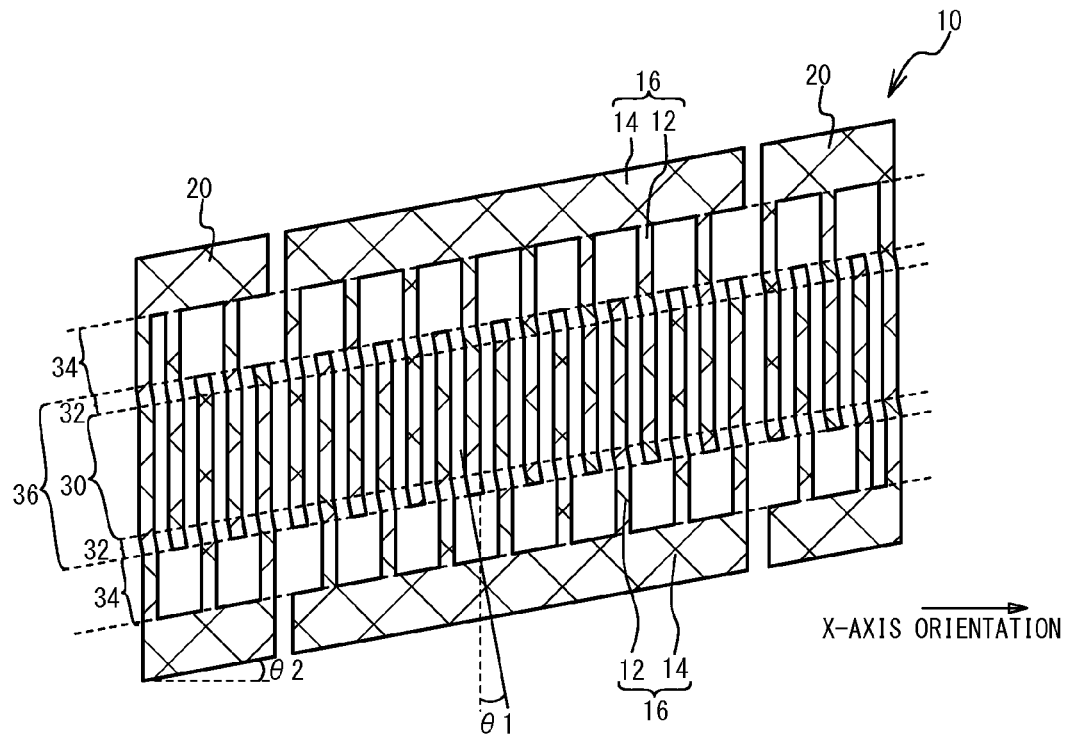
FIG. 18A and FIG. 18B are plan views of alternative resonators in accordance with the first embodiment and the first variation of the first embodiment, respectively.
Figure 18B:
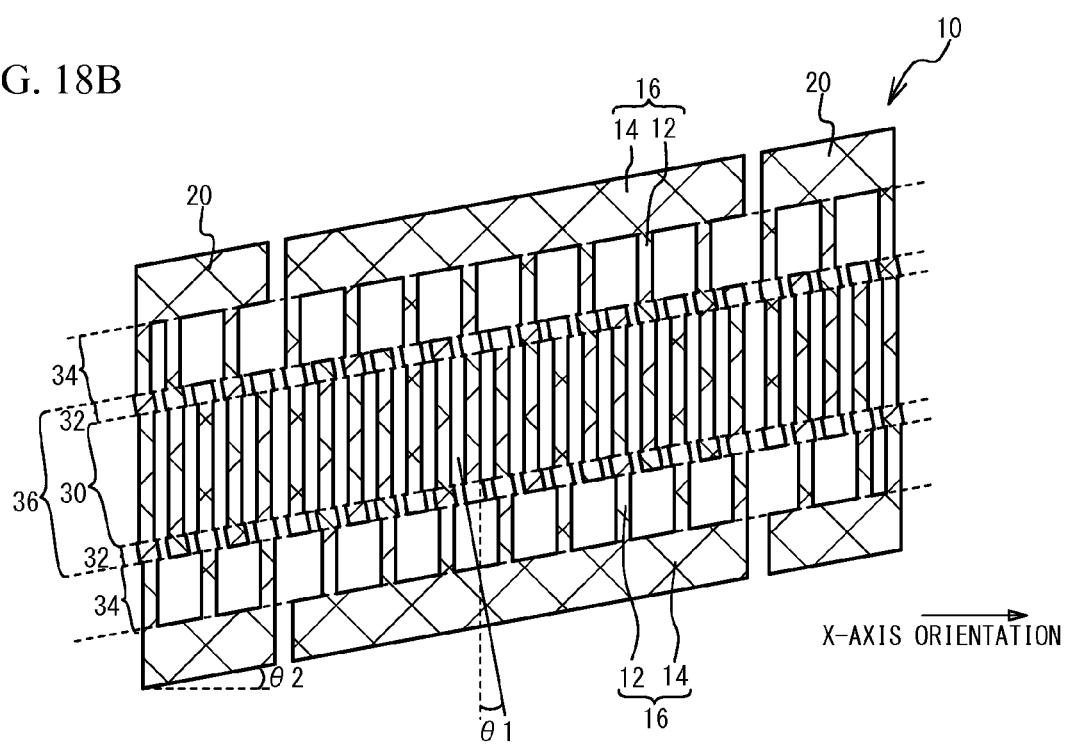

FIG. 18A and FIG. 18B are plan views of alternative resonators in accordance with the first embodiment and the first variation of the first embodiment. As illustrated in FIG. 18A and FIG. 18B, the electrode fingers of the reflector 20 alternately open in the gap region 34. Other structures are the same as those illustrated in FIG. 17A and FIG. 17B, and thus the description is omitted.

The first embodiment and its variations incline the electrode finger 12 in the edge region 32 with respect to the electrode finger 12 in the center region 30 so that the pitch PT2 in the width direction 42 of the electrode finger 12 in the edge region 32 is greater than the pitch PT1 in the width direction 40 of the electrode finger 12 in the center region 30 as illustrated in FIG. 8 when the anisotropy coefficient γ is positive. This allows the acoustic velocity in the edge region 32 to be less than that in the center region 30 as illustrated in FIG. 4A. Thus, undesired lateral-mode waves are reduced as illustrated in FIG. 2A, FIG. 12A, and FIG. 12B.

The free selection of the width direction 40 of the electrode finger 12 in the center region 30 causes increase of undesired SH-mode waves. The center region 30 mainly affects the characteristics of the acoustic wave device, and thus reduction in undesired waves in the center region 30 is more effective to reduce overall undesired waves than reduction in undesired waves in the edge region 32. Thus, the angle between the width direction 40 of the electrode finger 12 in the center region 30 and the X-axis orientation of the piezoelectric substrate 18 is made to be less than the angle between the width direction 42 of the electrode finger 12 in the edge region 32 and the X-axis orientation. This enables to reduce undesired SH-mode waves as illustrated in FIG. 6A, FIG. 6B, FIG. 16A, and FIG. 16B. Additionally, the width direction 40 of the electrode finger 12 in the center region 30 is made to be approximately parallel to the X-axis orientation. This enables to further reduce undesired SH-mode waves.

As illustrated in FIG. 8, when the pitch PT2 in the edge region 32 is made to be greater than the pitch PT1 in the center region 30, the direction 48 of the boundary between the edge region 32 and the center region 30 is parallel to the width direction 42 of the electrode finger 12 in the edge region 32.

The edge regions 32 are located at both sides of the center region 30, and the width directions 42 of the electrode fingers 12 in the edge regions 32 located at both sides of the center region 30 are parallel to each other. This structure allows the acoustic velocities in the edge regions 32 at both sides to be approximately the same. Thus, reduced is secondary distortion due to an asymmetric structure in which the acoustic velocities in the edge regions 32 at both sides differ from each other. As the inclination angle of the width direction 42 of the edge region 32 from the X-axis orientation increases, undesired SH-mode waves in the edge region 32 increase. For example, when the electrode fingers 12 in the edge regions 32 at both sides are inclined toward the same side (e.g., when both the electrode fingers 12 in the upper and lower edge regions 32 are inclined rightward in FIG. 7A), undesired waves increase. The effect of the undesired waves in the edge region 32 is reduced by making the width directions 42 in the edge regions 32 at both sides parallel to each other.

The extension direction 48 of the bus bar 14 is preferably parallel to the width direction 42 of the electrode finger 12 in the edge region 32. This structure allows the width in the gap region 34 to be uniform.

As illustrated in FIG. 7A and FIG. 8, the duty ratio of the electrode finger 12 in the edge region 32 is preferably equal to the duty ratio of the electrode finger 12 in the center region 30. This allows the acoustic wave device to be easily designed.

As illustrated in FIG. 13A, the duty ratio of the electrode finger 12 in the edge region 32 is preferably greater than the duty ratio of the electrode finger 12 in the center region 30. This enables to further reduce undesired lateral-mode waves as illustrated in FIG. 14A and FIG. 14B.

In the first embodiment and its variations, the crystal axis orientation of the piezoelectric substrate 18 is the X-axis orientation. When the width direction of the electrode finger 12 is inclined from the crystal axis orientation, undesired waves are easily generated. Thus, the angle between the width direction 40 of the electrode finger 12 in the center region 30 and the crystal axis orientation of the piezoelectric substrate 18 is required to be less than the angle between the width direction 42 of the electrode finger 12 in the edge region 32 and the crystal axis orientation.

When the piezoelectric substrate 18 is a rotated Y-cut X-propagation lithium niobate substrate and the width direction of the electrode finger 12 is inclined from the X-axis orientation, undesired waves are easily generated. Thus, in such a piezoelectric substrate 18, the width direction 40 of the electrode finger 12 in the center region 30 is made to be closer to the X-axis orientation than the width direction 42 of the electrode finger 12 in the edge region 32 is.

The center region 30 mainly contributes to characteristics of the acoustic wave device, and thus the width W30 of the center region 30 is preferably greater than the width W32 of the edge region 32. The width W30 is preferably greater than twice the width W32, and more preferably greater than 10 times the width W32.

Second Embodiment

Figure 19A:
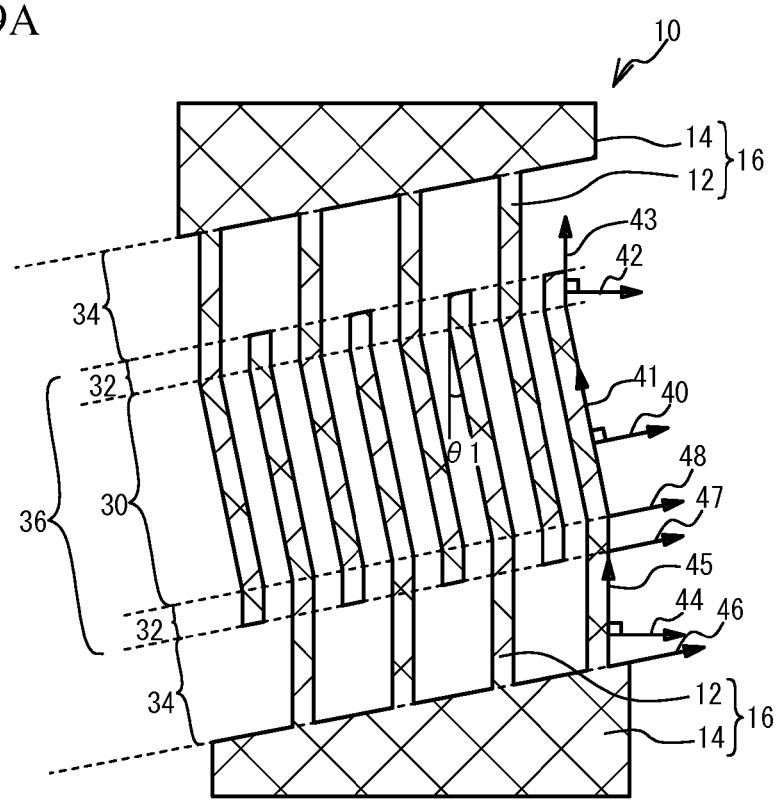
FIG. 19A and FIG. 19B are plan views of resonators in accordance with a second embodiment and a first variation of the second embodiment, respectively.
Figure 19B:
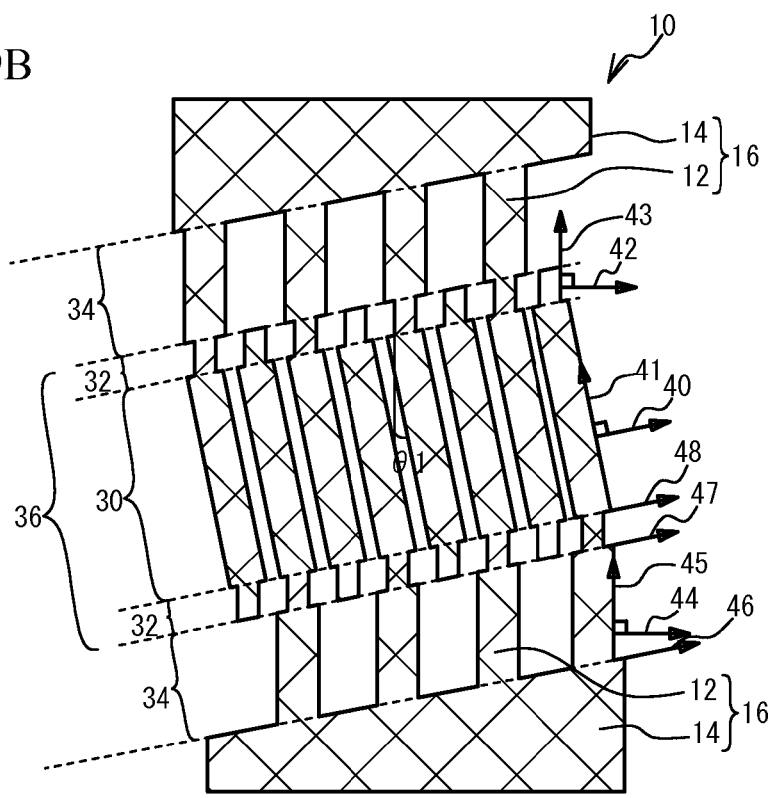

A second embodiment describes a case where the anisotropy coefficient γ is negative. FIG. 19A and FIG. 19B are plan views of resonators in accordance with the second embodiment and a first variation of the second embodiment, respectively. As illustrated in FIG. 19A, the width direction 40 of the electrode finger 12 in the center region 30 is parallel to the directions 46 through 48. This makes the pitch PT2 of the electrode finger 12 in the edge region 32 less than the pitch PT1 in the center region 30 as illustrated in FIG. 10B. The acoustic velocity in the edge region 32 is greater than that in the center region 30. Thus, undesired lateral-mode waves are reduced. Other structures are the same as those of the first embodiment, and thus the description is omitted.

As illustrated in FIG. 19B, the duty ratio of the electrode finger 12 in the center region 30 is adjusted to be greater than that in the edge region 32. This further decreases the acoustic velocity in the center region 30. Thus, undesired lateral-mode waves are reduced. The electrode finger 12 in the gap region 34 is made to have a large width. This decreases the acoustic velocity in the gap region 34. Thus, acoustic waves are confined by the overlap region 36. Other structures are the same as those of the second embodiment, and thus the description is omitted.

Figure 20A:
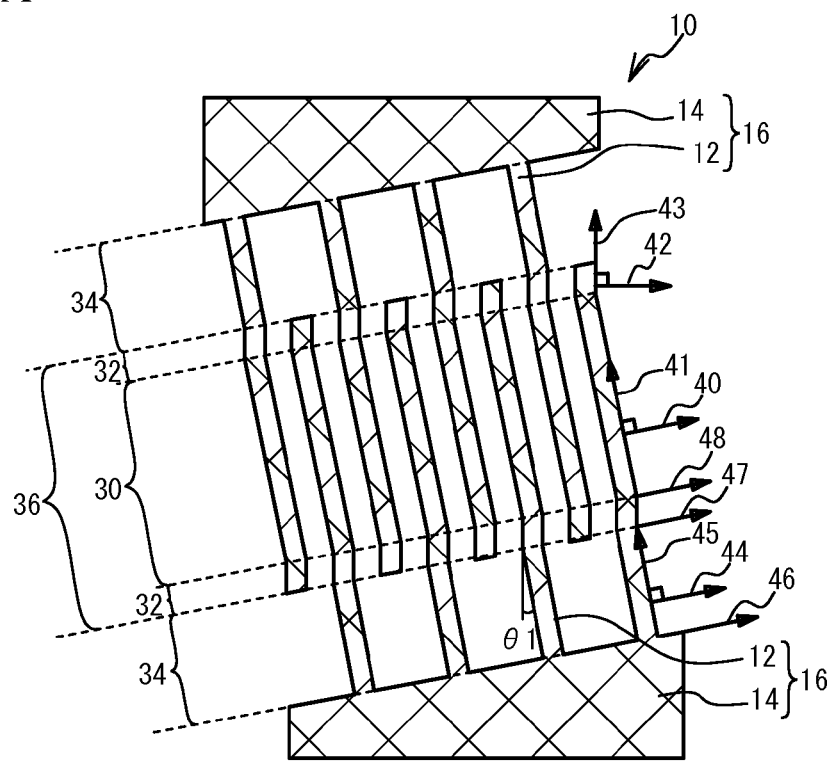
FIG. 20A and FIG. 20B are plan views of resonators in accordance with second and third variations of the second embodiment, respectively.
Figure 20B:
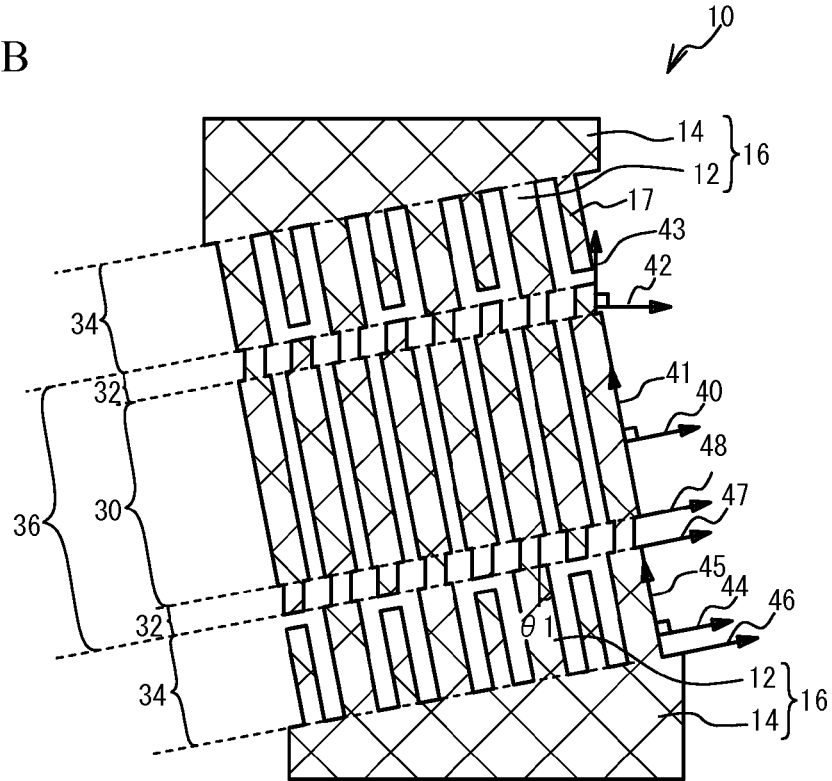

FIG. 20A and FIG. 20B are plan views of resonators in accordance with second and third variations of the second embodiment. As illustrated in FIG. 20A, the width direction 44 of the electrode finger 12 in the gap region 34 is parallel to the width direction 40 of the electrode finger 12 in the center region 30. This structure decreases the acoustic velocity in the gap region 34. Thus, acoustic waves are confined by the overlap region 36. Other structures are the same as those of the second embodiment, and thus the description is omitted.

As illustrated in FIG. 20B, dummy electrode fingers 17 are formed in the gap region 34. This structure decreases the acoustic velocity in the gap region 34. Thus, acoustic waves are confined by the overlap region 36. Other structures are the same as those of the first variation of the second embodiment, and thus the description is omitted.

The second embodiment and its variations incline the electrode finger 12 in the edge region 32 with respect to the electrode finger 12 in the center region 30 so that the pitch in the width direction 42 of the electrode finger 12 in the edge region 32 is less than the pitch in the width direction 40 of the electrode finger 12 in the center region 30. This structure allows the acoustic velocity in the edge region 32 to be greater than that in the center region 30. Thus, undesired lateral-mode waves are reduced as illustrated in FIG. 2B. The angle between the width direction 40 of the electrode finger 12 in the center region 30 and the X-axis orientation of the piezoelectric substrate 18 is less than the angle between the width direction 42 of the electrode finger 12 in the edge region 32 and the X-axis orientation. This structure enables to reduce SH-mode waves. The width directions 42 of the electrode fingers 12 in the edge regions 32 located at both sides of the center region 30 are parallel to each other. This structure reduces undesired waves.

When the pitch P2 in the edge region 32 is less than the pitch P1 in the center region 30 as illustrated in FIG. 10B, the extension directions 48 in the edge region 32 and the center region 30 are parallel to the width direction 40 of the electrode finger 12 in the center region 30.

As illustrated in FIG. 19B, the duty ratio of the electrode finger 12 in the edge region 32 is made to be less than the duty ratio of the electrode finger 12 in the center region 30. This structure further reduces undesired lateral-mode waves.

The first and second embodiments and their variations employ a Y-cut X-propagation lithium niobate substrate for the piezoelectric substrate 18 as an example, but the piezoelectric substrate 18 may be a Y-cut X-propagation lithium tantalate substrate. The Y-cut X-propagation lithium tantalate substrate has a negative anisotropy coefficient $\gamma$, and thus the use of the second embodiment and its variations is preferable. When the piezoelectric substrate 18 is a Y-cut X-propagation lithium tantalate substrate and the anisotropy coefficient $\gamma$ of the acoustic wave device is positive due to the heavy metal film 28, the use of the first embodiment and its variation is preferable.

Third Embodiment

Figure 21:
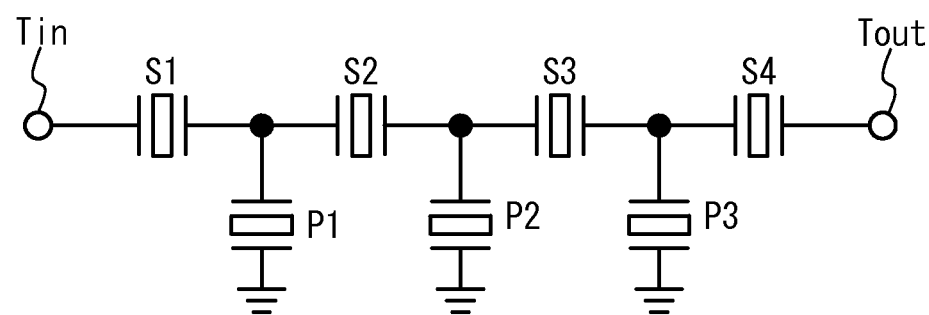
FIG. 21 is a circuit diagram of a filter in accordance with a third embodiment.

A third embodiment fabricates a filter including the resonator according to any one of the first and second embodiments and their variations. FIG. 21 is a circuit diagram of a filter in accordance with the third embodiment. As illustrated in FIG. 21, the filter of the third embodiment is a ladder-type filter. Series resonators S1 through S4 are connected in series between an input terminal Tin and an output terminal Tout. Parallel resonators P1 through P3 are connected in parallel between the input terminal Tin and the output terminal Tout.

Figure 22A:
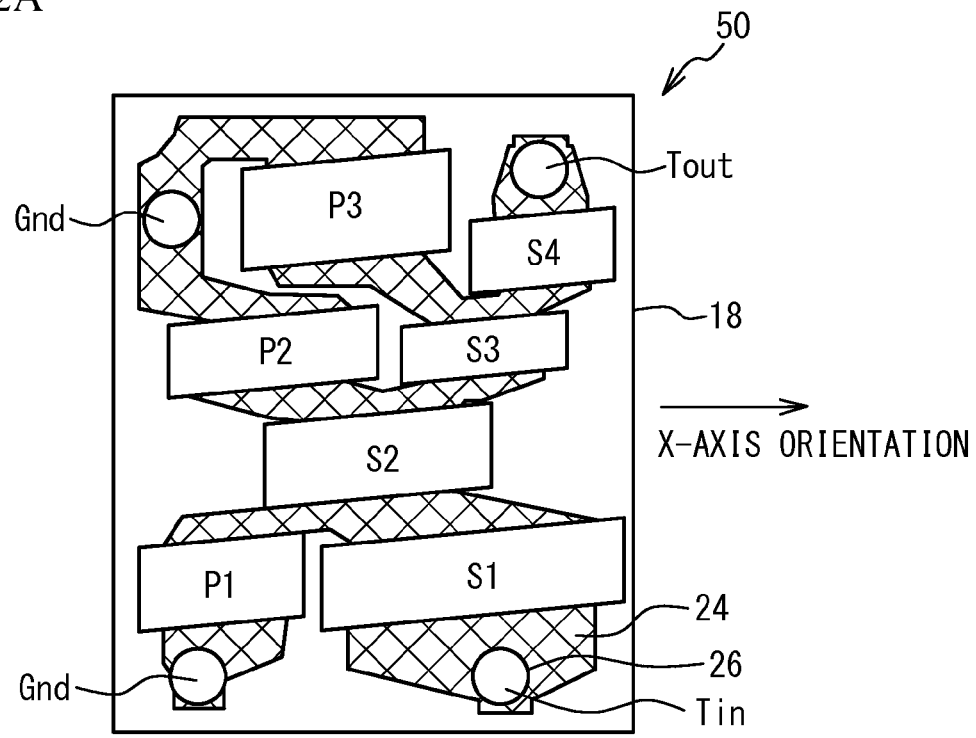
FIG. 22A and FIG. 22B are plan views of filter chips in accordance with the third embodiment and a sixth comparative example.
Figure 22B:
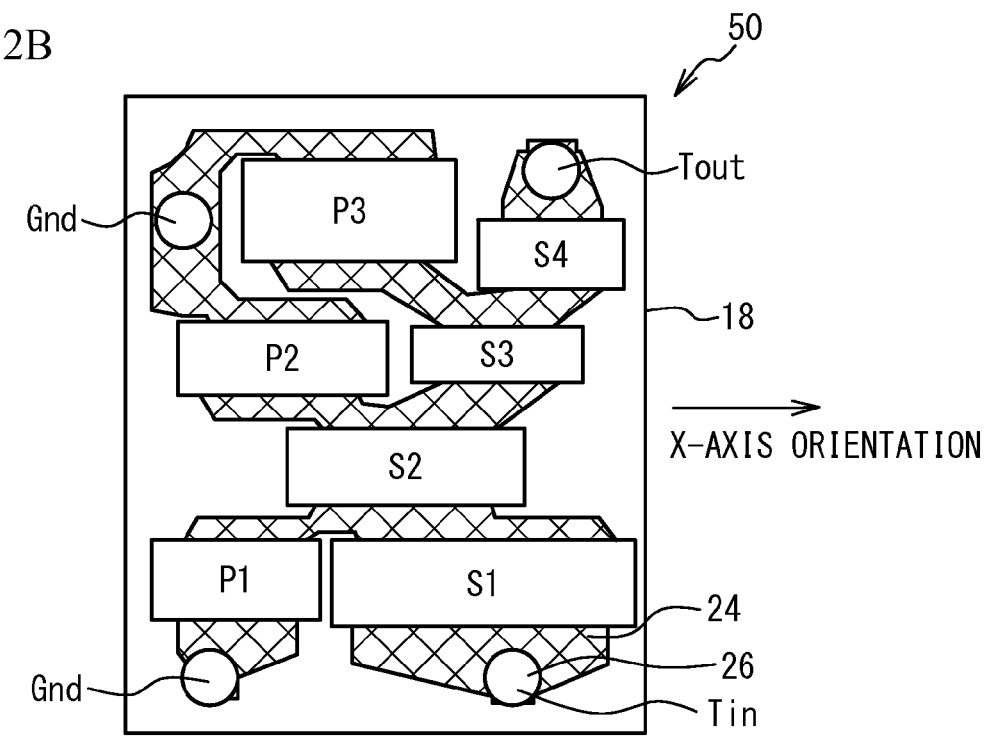

FIG. 22A and FIG. 22B are plan views of filter chips in the third embodiment and a sixth comparative example. As illustrated in FIG. 22A and FIG. 22B, a filter chip 50 includes the series resonators S1 through S4 and the parallel resonators P1 through P3 formed on the piezoelectric substrate 18. The resonators S1 through S4 and P1 through P3 are electrically interconnected by lines 24. Bumps 26 to be connected to the lines 24 are formed. The bumps 26 correspond to the input terminal Tin, the output terminal Tout, and ground terminals.

The third embodiment and the sixth comparative example use a 127.86°-rotated Y-cut X-propagation $LiNbO_3$ substrate for the piezoelectric substrate 18, copper for the material of the metal film 28 of the resonator, and silicon oxide for the material of the dielectric film 22. The anisotropy coefficient $\gamma$ is positive. The conditions of the third embodiment are as follows.
Duty ratio in the center region 30: 50%
Duty ratio in the edge region 32: 60%
Width W32 of the edge region 32: 1.4$\lambda$
Width W34 of the gap region 34: 2.5$\lambda$
Angle $\theta1$: 5°
Angle $\theta2$: 5°
The conditions of the sixth comparative example are as follows.
Duty ratio in the IDT: 50%
Width W34 of the gap region 34: 0.5 μm, including a dummy electrode with a length of 2$\lambda$
Angle $\theta1$: 0°
Angle $\theta2$: 0°
Other conditions of each of the resonators are optimized in both the third embodiment and the sixth comparative example.

As described above, in both the third embodiment and the sixth comparative example, the width direction 40 of the electrode finger 12 in the center region 30 corresponds to the X-axis orientation. In the third embodiment, the electrode finger 12 is inclined so that the pitch of the electrode finger 12 in the edge region 32 is greater than that in the center region 30. In the sixth comparative example, the extension direction of the electrode finger 12 in the edge region 32 is the same as the extension direction of the electrode finger 12 in the center region 30.

Figure 23A:
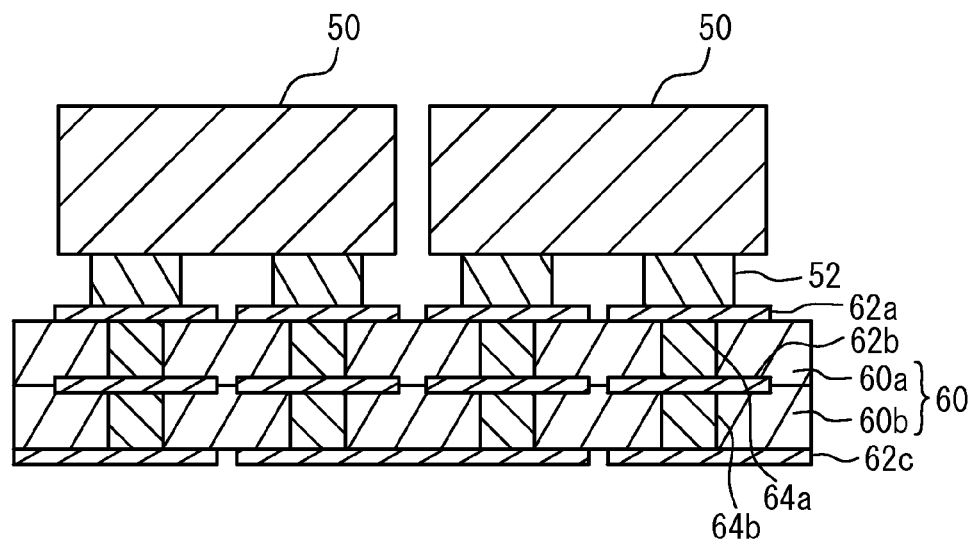
FIG. 23A is a cross-sectional view illustrating the filter chip mounted on a multilayered substrate.
Figure 23B:
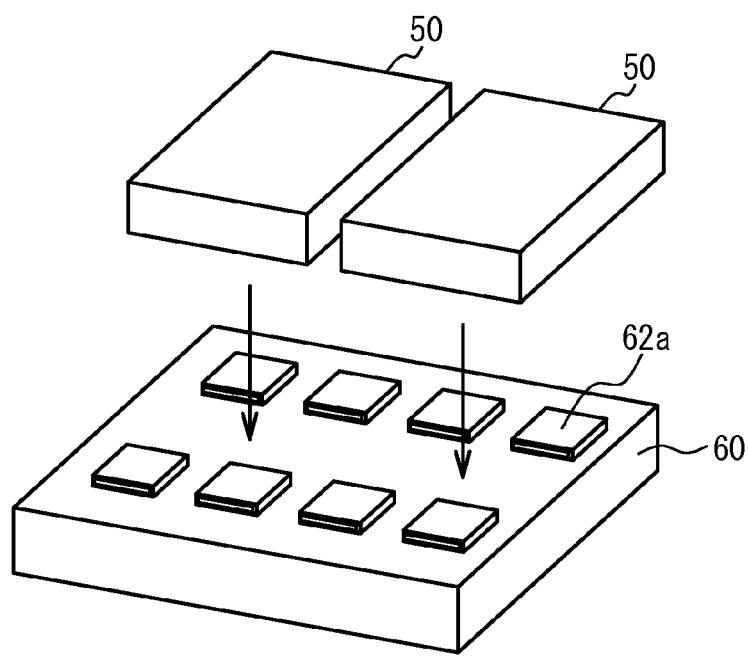
FIG. 23B is a perspective view illustrating the filter chip that is about to be mounted on a multilayered substrate.

FIG. 23A is a cross-sectional view of the filter chip mounted on a multilayered substrate, and FIG. 23B is a perspective view of the filter chip that is about to be mounted on the multilayered substrate. A multilayered substrate 60 includes ceramic layers 60a and 60b. A metal layer 62a is formed on the ceramic layer 60a, a metal layer 62b is formed between the ceramic layers 60a and 60b, and a metal layer 62c is formed under the ceramic layer 60b. The metal layer 62a includes pads to which the bumps are bonded. The metal layer 62b includes lines. The metal layer 62c includes foot pads. Penetrating electrodes 64a and 64b respectively penetrating through the ceramic layers 60a and 60b are formed. As illustrated in FIG. 23B, the filter chip 50 is bonded to the metal layer 62a through gold bumps 52. The metal layer 62a is electrically coupled to the metal layer 62c through the penetrating electrode 64a, the metal layer 62b, and the penetrating electrode 64b.

Figure 24A:
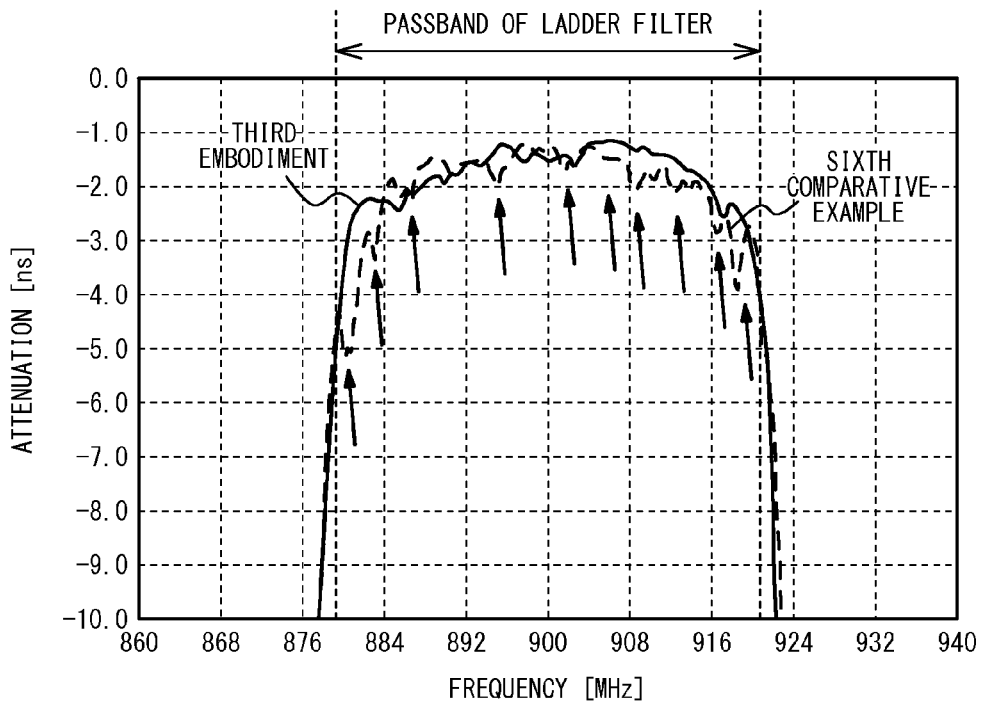
FIG. 24A is a graph of the pass characteristics in the third embodiment and the sixth comparative example.
Figure 24B:
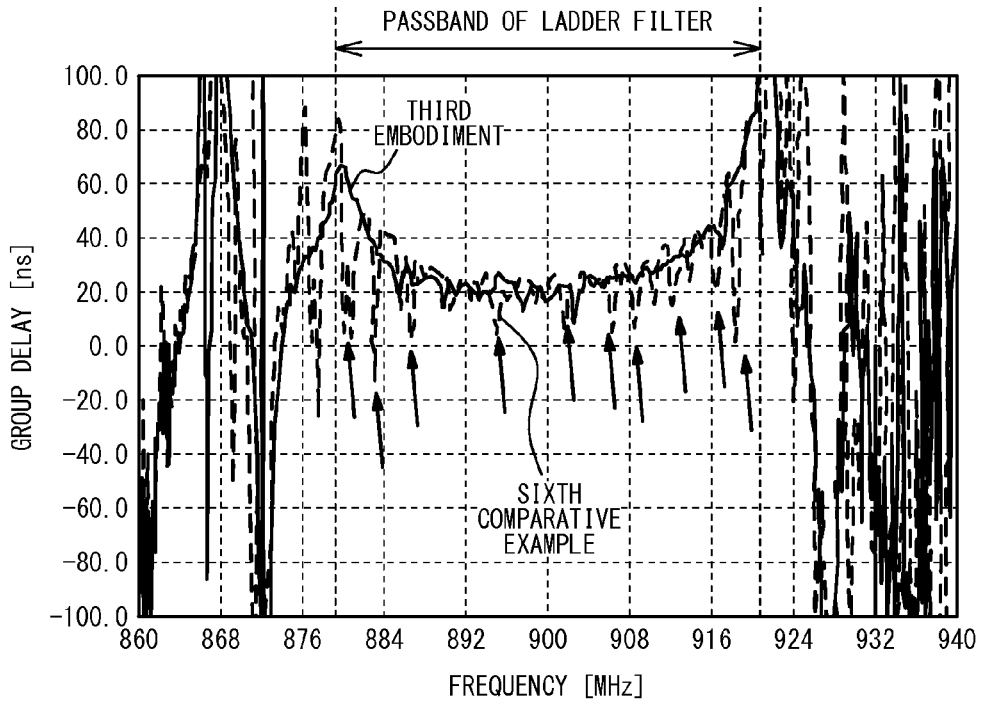
FIG. 24B is a graph of group delay.

FIG. 24A is a graph of the pass characteristics in the third embodiment and the sixth comparative example, and FIG. 24B is a graph of group delay. As illustrated in FIG. 24A and FIG. 24B, in the sixth comparative example, responses due to undesired waves indicated by arrows are observed in the passband of the filter. In the third embodiment, undesired waves are reduced.

As described above, the use of the resonator according to any one of the first and second embodiments and their variations for a filter enables to reduce undesired waves in the passband, and achieve smooth characteristics in the passband.

Fourth Embodiment

Figure 25A:
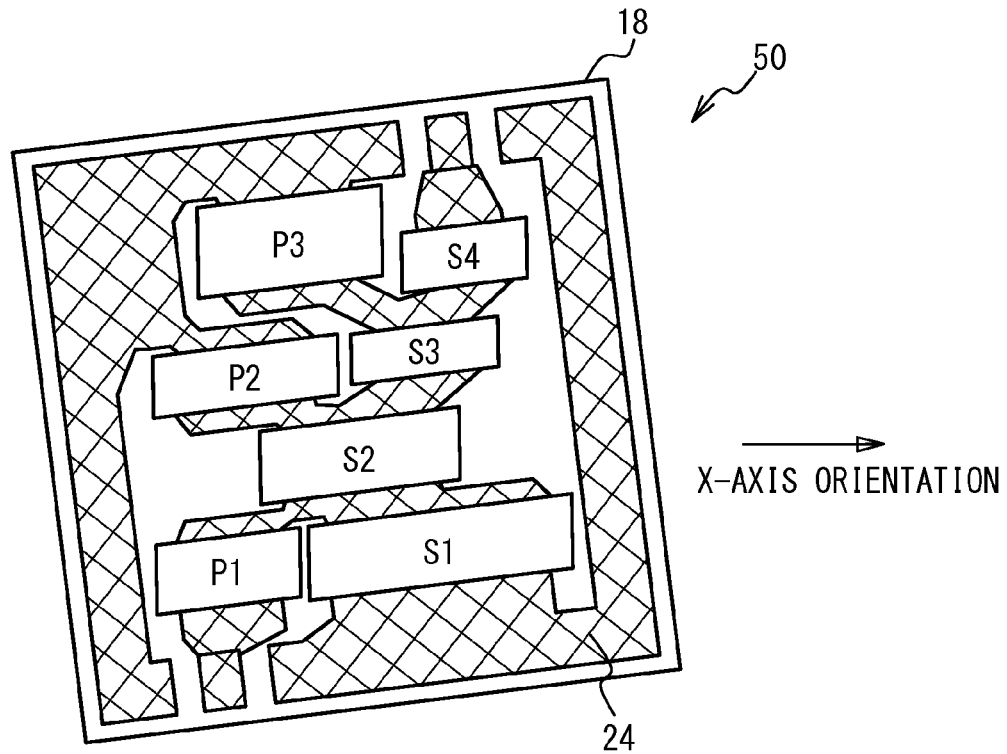
FIG. 25A and FIG. 25B are plan views of filter chips in accordance with a fourth embodiment and a seventh comparative example, respectively.
Figure 25B:
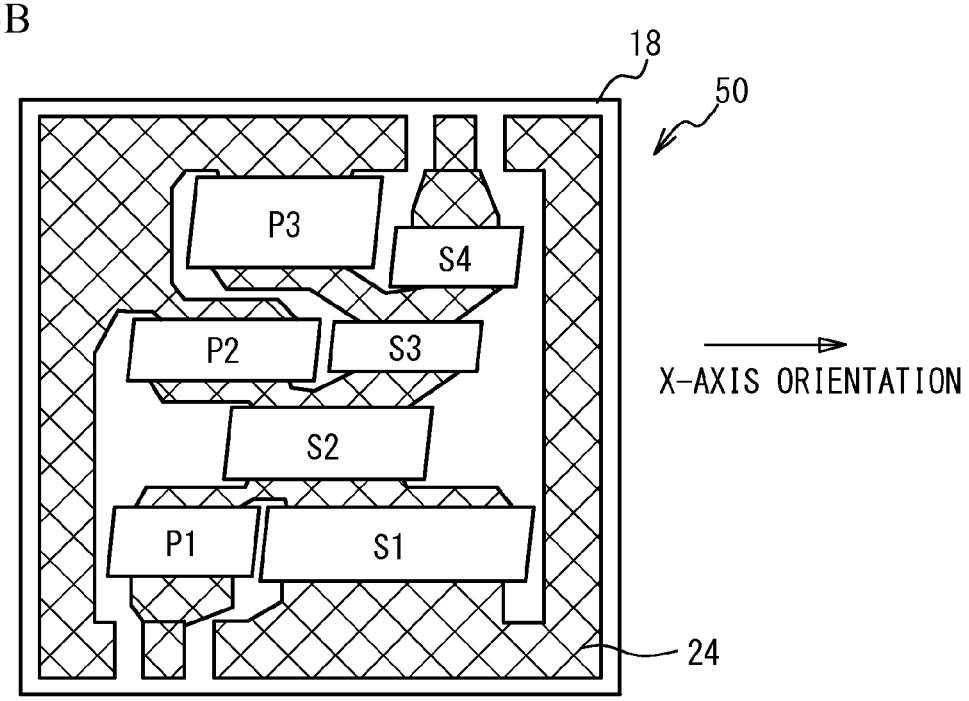

A fourth embodiment fabricates an alternative filter including the resonator according to any one of the first and second embodiments and their variations. FIG. 25A and FIG. 25B are plan views of filter chips in accordance with the fourth embodiment and a seventh comparative example. As illustrated in FIG. 25A and FIG. 25B, the filter chip 50 includes the series resonators S1 through S4 and the parallel resonators P1 through P3 formed on the piezoelectric substrate 18. The resonators S1 through S4 and P1 through P3 are electrically interconnected by the lines 24. The conditions of the fourth embodiment are the same as those of the third embodiment. The seventh comparative example differs from the fourth embodiment in that the angle θ2 is 0°. Other conditions of each of the resonators are optimized in both the fourth embodiment and the seventh comparative example.

As described above, the width direction 40 of the electrode finger 12 in the center region 30 corresponds to the X-axis orientation in the fourth embodiment, while the width direction 42 of the electrode finger 12 in the edge region 32 corresponds to the X-axis orientation and the width direction 40 of the electrode finger 12 in the center region 30 is inclined at an angle θ2 of 5° from the X-axis orientation in the seventh comparative example.

Figure 26:
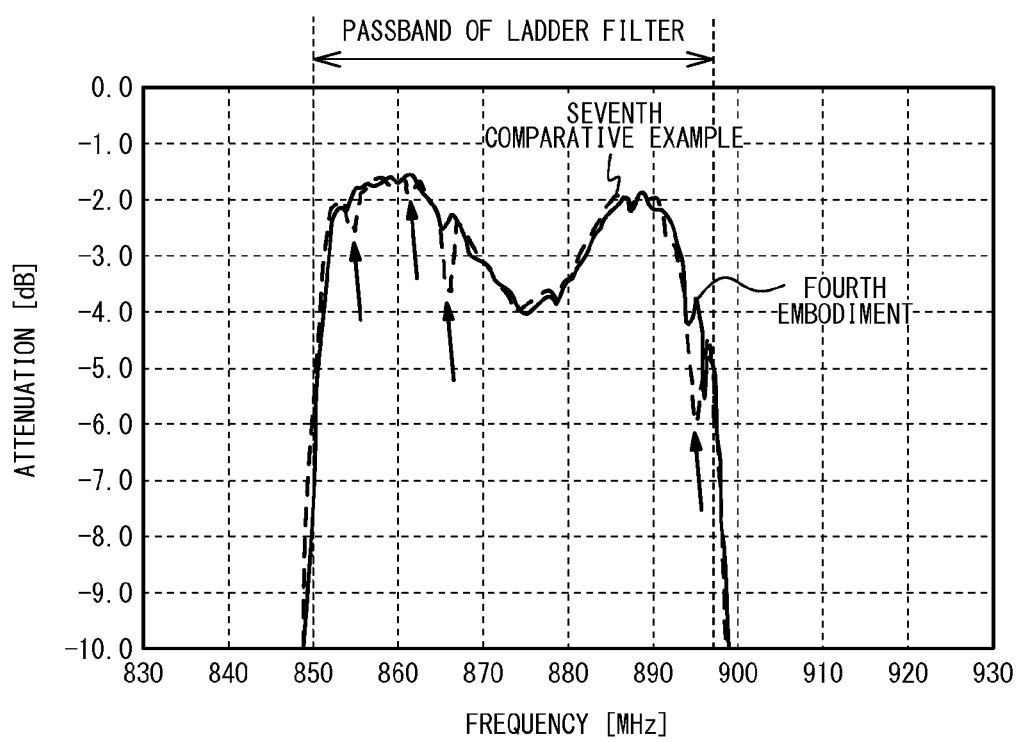
FIG. 26 is a graph of the pass characteristics in the fourth embodiment and the seventh comparative example.

FIG. 26 is a graph of the pass characteristics of the fourth embodiment and the seventh comparative example. As illustrated in FIG. 26, in the seventh comparative example, responses due to undesired waves ranging from 0.5 dB to 2 dB are observed in the passband. In the fourth embodiment, undesired waves are reduced.

As described in the third and fourth embodiments, the electrode finger 12 in the edge region 32 is inclined with respect to the electrode finger 12 in the center region 30 so that the pitch in the width direction 42 of the electrode finger 12 in the edge region 32 is greater than the pitch in the width direction 42 of the electrode finger 12 in the center region 30. The width direction 40 of the electrode finger 12 in the center region 30 is adjusted to be closer to the X-axis orientation than the width direction 42 of the electrode finger 12 in the edge region 32 is. This structure enables to reduce undesired waves as illustrated in FIG. 24A, FIG. 24B, and FIG. 26.

Figure 27A:
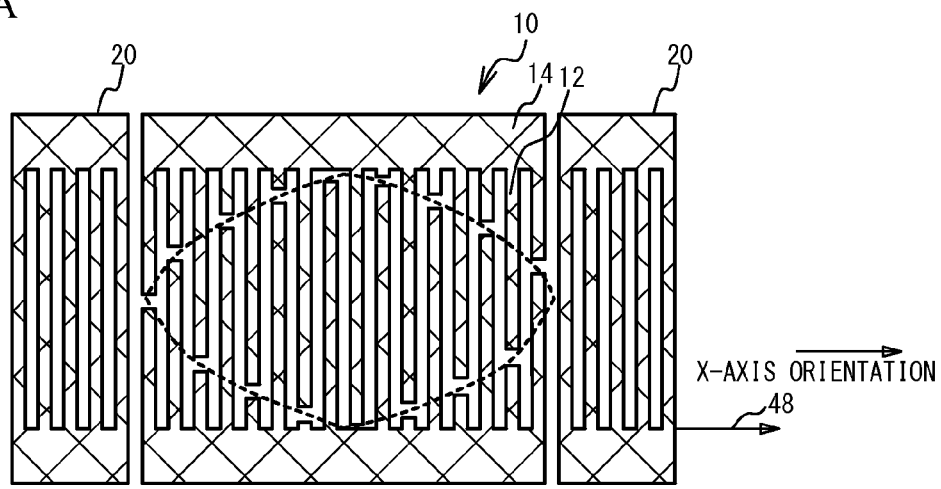
FIG. 27A through FIG. 27C are plan views (No. 1) of exemplary resonators included in the filter of the third embodiment.
Figure 27B:
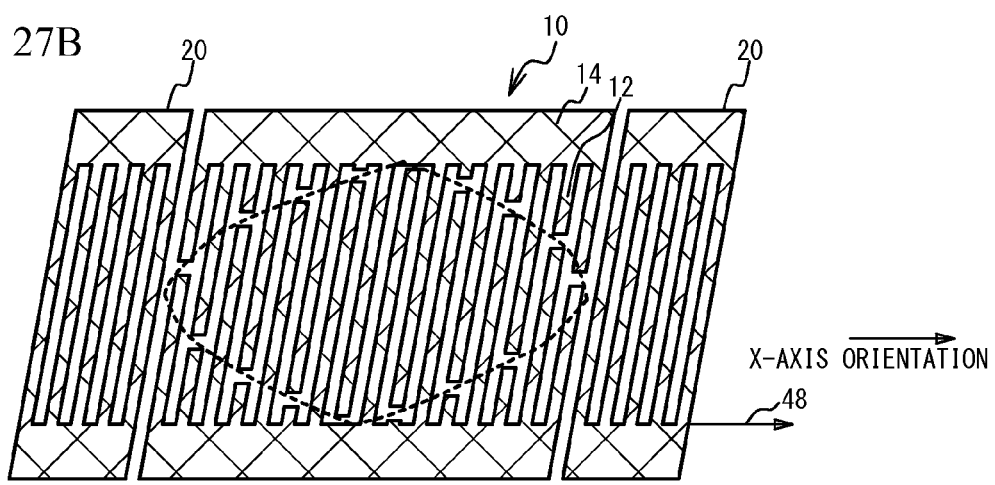
Figure 27C:
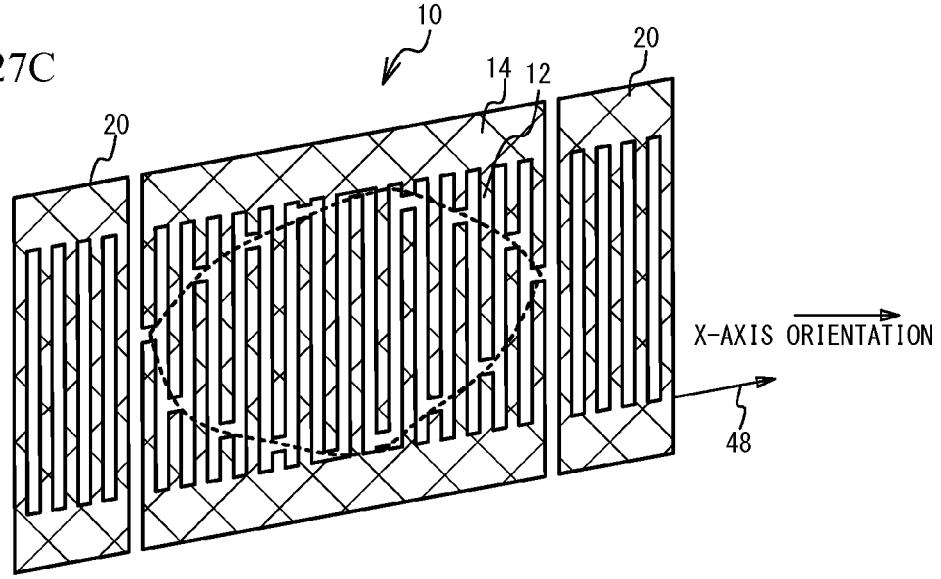

In the third and fourth embodiments, all the resonators included in the filter are the resonator of the first variation of the first embodiment, but the filter is required to include at least one resonator according to any one of the first and second embodiments and their variations. FIG. 27A through FIG. 28C are plan views of exemplary resonators included in the filter of the third embodiment. As illustrated in FIG. 27A, one or more of the resonators in the filter may be an apodized resonator in which the extension direction of the bus bar 14 corresponds to the X-axis orientation and the extension direction of the electrode finger 12 is perpendicular to the extension direction of the bus bar 14. As illustrated in FIG. 27B, one or more of the resonators in the filter may be an apodized resonator in which the extension direction of the bus bar 14 corresponds to the X-axis orientation and the extension direction of the electrode finger 12 is inclined from a direction perpendicular to the extension direction of the bus bar 14. As illustrated in FIG. 27C, one or more of the resonators in the filter may be an apodized resonator in which the extension direction of the bus bar 14 is inclined from the X-axis orientation and the extension direction of the electrode finger 12 is inclined from a direction perpendicular to the extension direction of the bus bar 14.

Figure 28A:
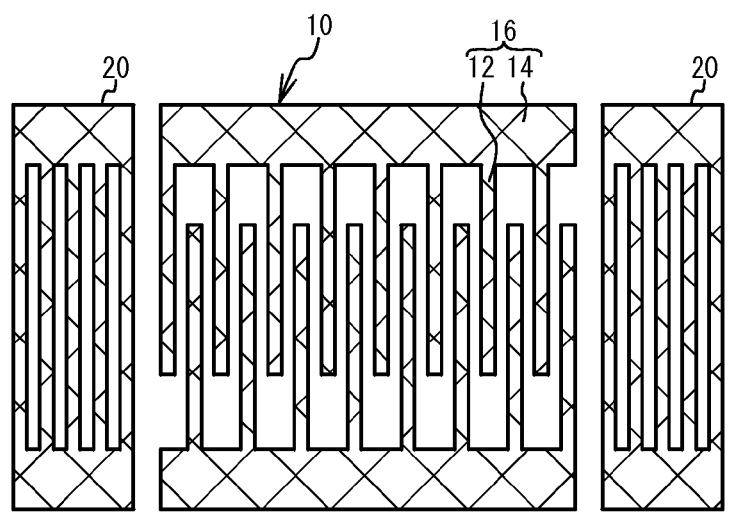
FIG. 28A through FIG. 28C are plan views (No. 2) of exemplary resonators included in the filter of the third embodiment.
Figure 28B:
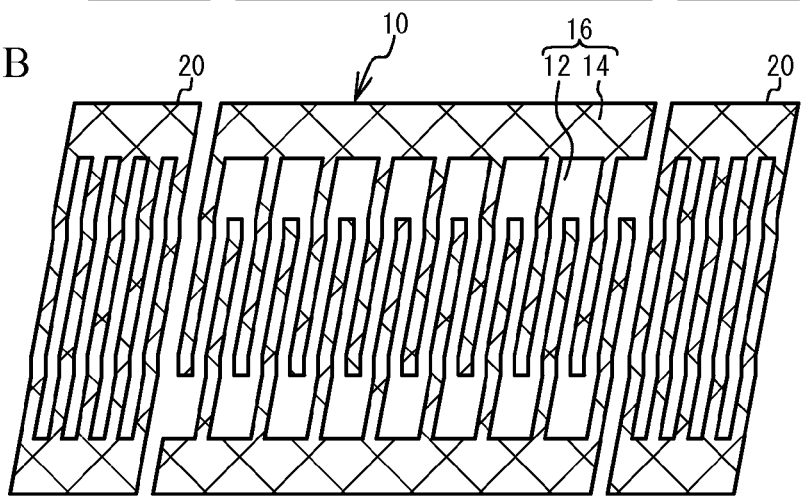
Figure 28C:
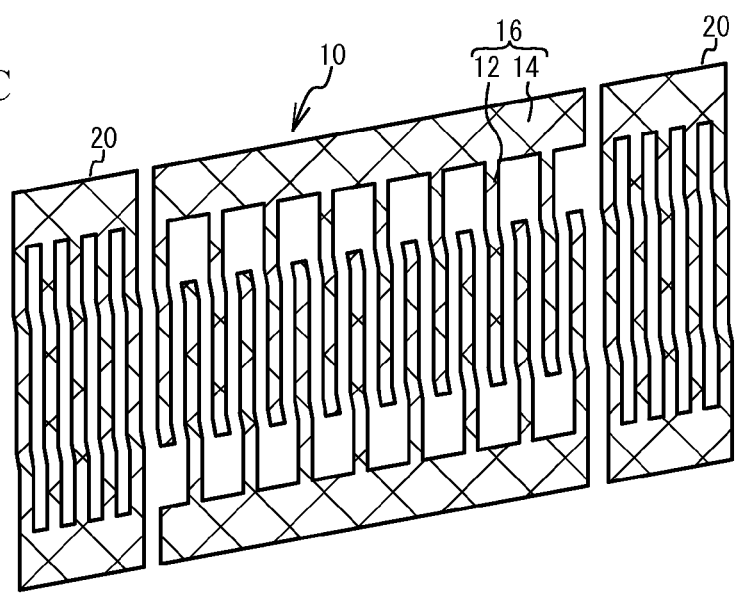

As illustrated in FIG. 28A, one or more of the resonators in the filter may be a resonator in which the extension direction of the bus bar 14 corresponds to the X-axis orientation and the extension direction of the electrode finger 12 is perpendicular to the extension direction of the bus bar 14. As illustrated in FIG. 28B, one or more of the resonators in the filter may be a resonator in which the extension direction of the bus bar 14 corresponds to the X-axis orientation and the extension direction of the electrode finger 12 in the edge region 32 is inclined from the extension direction of the electrode finger 12 in the center region 30. As illustrated in FIG. 28C, one or more of the resonators in the filter may be a resonator in which the extension direction of the bus bar 14 is inclined from the X-axis orientation and the extension direction of the electrode finger 12 in the edge region 32 is inclined from the extension direction of the electrode finger 12 in the center region 30.

The number of the series resonators and the parallel resonator in the ladder-type filter are freely selected. The embodiments use the ladder-type filter as an example of a filter, but the filter may be a multimode type filter. Furthermore, a filter including the resonator according to any one of the first and second embodiments and their variations may be used for at least one of the transmit filter and the receive filter of a duplexer. Furthermore, a filter including the resonator according to any one of the first and second embodiments and their variations may be used for a communication module.

The embodiments use a Rayleigh type acoustic wave device including the dielectric film 22 formed on the piezoelectric substrate 18 for explanation, but the acoustic wave device may be a leaky type acoustic wave device in which the dielectric film 22 is not formed except a protective film. The dielectric film 22 may be single-layered, or multi-layered. Acoustic wave devices including a single layered dielectric film include a leaky type surface acoustic wave device, a Love wave device, and a boundary acoustic wave device. Acoustic wave devices including a multi-layered dielectric film 22 includes a leaky type surface acoustic wave device, a Rayleigh type surface acoustic wave device, a Love wave device, and a boundary acoustic wave device.

Acoustic wave devices including a lithium tantalate substrate bonded on a sapphire substrate or acoustic wave devices including a dielectric film, such as a silicon oxide film, covering the first surface or the second surface of the piezoelectric substrate have excellent temperature characteristics. However, in such acoustic wave devices, new bulk waves and/or undesired lateral-mode waves are easily generated. Therefore, it is preferable to apply the first through fourth embodiments and their variations to such acoustic wave devices.

Although the embodiments of the present invention have been described in detail, it is to be understood that the various change, substitutions, and alterations could be made hereto without departing from the spirit and scope of the invention.

What is claimed is:
1. An acoustic wave device comprising:
a piezoelectric substrate; and
an Interdigital Transducer (IDT) formed on the piezoelectric substrate, including electrode fingers, and exciting an acoustic wave, wherein an anisotropy coefficient is positive, an overlap region where the electrode fingers of the IDT overlap each other includes a center region located in a center of the overlap region in an extension direction of the electrode finger and an edge region located at an edge of the overlap region in the extension direction, the electrode finger in the center region and the electrode finger in the edge region are continuously formed, the electrode finger in the edge region is inclined with respect to the electrode finger in the center region so that a pitch in a width direction of the electrode finger in the edge region is greater than a pitch in a width direction of the electrode finger in the center region, and an angle between the width direction of the electrode finger in the center region and a crystal axis orientation of the piezoelectric substrate is less than an angle between the width direction of the electrode finger in the edge region and the crystal axis orientation.

2. The acoustic wave device according to claim 1, wherein a boundary between the edge region and the center region is parallel to the width direction of the electrode finger in the edge region.

3. The acoustic wave device according to claim 1, wherein the width direction of the electrode finger in the center region is parallel to the crystal axis orientation.

4. The acoustic wave device according to claim 1, wherein the width directions of the electrode fingers in the edge regions located at both sides of the center region are parallel to each other.

5. The acoustic wave device according to claim 1, wherein the IDT includes a bus bar, and an extension direction of the bus bar is parallel to the width direction of the electrode finger in the edge region.

6. The acoustic wave device according to claim 1, wherein a duty ratio of the electrode finger in the edge region is equal to a duty ratio of the electrode finger in the center region.

7. The acoustic wave device according to claim 1, wherein a duty ratio of the electrode finger in the edge region is greater than a duty ratio of the electrode finger in the center region.

8. The acoustic wave device according to claim 1, wherein the piezoelectric substrate is a rotated Y-cut X-propagation lithium niobate substrate, and the crystal axis orientation is an X-axis orientation of the piezoelectric substrate.

9. The acoustic wave device according to claim 8, further comprising:

a silicon oxide film formed on the piezoelectric substrate to cover the IDT.

10. The acoustic wave device according to claim 1, further comprising:

a filter including the IDT.

11. An acoustic wave device comprising:

a piezoelectric substrate; and an Interdigital Transducer (IDT) formed on the piezoelectric substrate, including electrode fingers, and exciting an acoustic wave, wherein an anisotropy coefficient is negative, an overlap region where the electrode fingers of the IDT overlap each other includes a center region located in a center of the overlap region in an extension direction of the electrode finger and edge regions located at both sides of the center region in the extension direction, the electrode finger in the center region and the electrode finger in the edge region are continuously formed, the electrode finger in the edge region is inclined with respect to the electrode finger in the center region so that a pitch in a width direction of the electrode finger in the edge region is less than a pitch in the width direction of the electrode finger in the center region, an angle between the width direction of the electrode finger in the center region and a crystal axis orientation of the piezoelectric substrate is less than an angle between the width direction of the electrode finger in the edge region and the crystal axis orientation, and the width directions of the electrode fingers in the edge regions located at both sides of the center region are parallel to each other.

12. The acoustic wave device according to claim 11, wherein a boundary between the edge region and the center region is parallel to the width direction of the electrode finger in the center region.

13. The acoustic wave device according to claim 11, wherein a duty ratio of the electrode finger in the edge region is less than a duty ratio of the electrode finger in the center region.

14. The acoustic wave device according to claim 11, further comprising:

a filter including the IDT.

* * * * *